(12) United States Patent
Tanaka et al.

(10) Patent No.: US 12,368,043 B2
(45) Date of Patent: **\*Jul. 22, 2025**

(54) SUBSTRATE PROCESSING APPARATUS, PROCESSING METHOD, AND NON-TRANSITORY COMPUTER-READABLE RECORDING MEDIUM

(71) Applicant: Kokusai Electric Corporation, Tokyo (JP)

(72) Inventors: Akinori Tanaka, Toyama (JP); Hideto Tateno, Toyama (JP); Sadayoshi Horii, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 18/526,472

(22) Filed: Dec. 1, 2023

(65) Prior Publication Data

US 2024/0096615 A1 Mar. 21, 2024

Related U.S. Application Data

(63) Continuation of application No. 17/943,843, filed on Sep. 13, 2022, now Pat. No. 11,869,764, which is a (Continued)

(51) Int. Cl.
*H01L 21/02* (2006.01)
*C23C 16/40* (2006.01)
(Continued)

(52) U.S. Cl.
CPC ...... *H01L 21/02271* (2013.01); *C23C 16/401* (2013.01); *C23C 16/4412* (2013.01);
(Continued)

(58) Field of Classification Search
CPC ......... H01L 21/02271; H01L 21/02164; H01L 21/02222; H01L 21/02282;
(Continued)

(56) References Cited

U.S. PATENT DOCUMENTS 5,565,038 A 10/1996 Ashley
5,582,647 A 12/1996 Manabu et al.
(Continued)

FOREIGN PATENT DOCUMENTS

JP H07307301 A 11/1995
JP 2002-134414 A 5/2002
(Continued)

OTHER PUBLICATIONS

Brown, et al., "Infrared and Near-Infrared Analyzers," Instrument Engineers Handbook, vol. 1, Process Measurement and Analysis, 2003, pp. 1369-1387.
(Continued)

*Primary Examiner* — Jeffrie R Lund
(74) *Attorney, Agent, or Firm* — Volpe Koenig

(57) ABSTRACT

Described herein is a technique capable of acquiring, monitoring, and recording the progress of the reaction between a substrate and a reactive gas contained in a process gas in a process chamber during the processing of the substrate. According to the technique, there is provided a substrate processing apparatus including: a process chamber accommodating a substrate; a process gas supply system configured to supply a process gas into the process chamber via a process gas supply pipe; an exhaust pipe configured to exhaust an inner atmosphere of the process chamber; a first gas concentration sensor configured to detect a first concentration of a reactive gas contained in the process gas in the process gas supply pipe; and a second gas concentration (Continued)

sensor configured to detect a second concentration of the reactive gas contained in an exhaust gas in the exhaust pipe.

19 Claims, 8 Drawing Sheets

Related U.S. Application Data continuation of application No. 15/918,858, filed on Mar. 12, 2018, now Pat. No. 11,476,112, which is a continuation of application No. PCT/JP2015/077502, filed on Sep. 29, 2015.

(51) Int. Cl.
| | |
|---|---|
| C23C 16/44 | (2006.01) |
| C23C 16/448 | (2006.01) |
| C23C 16/455 | (2006.01) |
| C23C 16/56 | (2006.01) |
| H01J 37/32 | (2006.01) |
| H01L 21/31 | (2006.01) |
| H01L 21/67 | (2006.01) |

(52) U.S. Cl.
CPC .... *C23C 16/4485* (2013.01); *C23C 16/45561* (2013.01); *C23C 16/56* (2013.01); *H01J 37/32449* (2013.01); *H01L 21/02164* (2013.01); *H01L 21/02222* (2013.01); *H01L 21/02282* (2013.01); *H01L 21/02326* (2013.01); *H01L 21/02337* (2013.01); *H01L 21/0262* (2013.01); *H01L 21/31* (2013.01); *H01L 21/67017* (2013.01); *H01L 21/67109* (2013.01); *H01L 21/67253* (2013.01)

(58) Field of Classification Search
CPC ......... H01L 21/02326; H01L 21/02337; H01L 21/0262; H01L 21/31; H01L 21/67017; H01L 21/67109; H01L 21/67253; C23C 16/401; C23C 16/4412; C23C 16/4485; C23C 16/45561; C23C 16/56; H01J 37/32449; Y02C 20/30; Y02P 70/50
See application file for complete search history.

(56) References Cited

U.S. PATENT DOCUMENTS

| | | | |
|---|---|---|---|
| 5,722,441 A | 3/1998 | Teramoto | |
| 6,463,941 B1 | 10/2002 | Takita | |
| 11,476,112 B2 | 10/2022 | Tanaka et al. | |
| 11,869,764 B2 * | 1/2024 | Tanaka | H01L 21/67017 |
| 2003/0121799 A1 | 7/2003 | Stevens et al. | |
| 2003/0234030 A1 | 12/2003 | Shibayama | |
| 2004/0007180 A1 | 1/2004 | Yamasaki et al. | |
| 2004/0065547 A1 | 4/2004 | Stevens et al. | |
| 2004/0157347 A1 | 8/2004 | Komiyama et al. | |
| 2005/0095859 A1 | 5/2005 | Chen et al. | |
| 2005/0171702 A1 | 8/2005 | Calabrese et al. | |
| 2005/0252449 A1 | 11/2005 | Nguyen et al. | |
| 2007/0184179 A1 | 8/2007 | Waghray et al. | |
| 2008/0105317 A1 | 5/2008 | Litecky et al. | |
| 2008/0171142 A1 | 7/2008 | Matsumoto et al. | |
| 2009/0320881 A1 | 12/2009 | Aitchison | |
| 2010/0071438 A1 | 3/2010 | Davis et al. | |
| 2010/0212773 A1 | 8/2010 | Cluesserath et al. | |
| 2011/0070666 A1 | 3/2011 | Paik et al. | |
| 2012/0098107 A1 | 4/2012 | Raisanen et al. | |
| 2013/0048853 A1 | 2/2013 | Nunoshige et al. | |
| 2013/0316515 A1 | 11/2013 | Nagahara et al. | |
| 2014/0235068 A1 | 8/2014 | Ashihara et al. | |
| 2014/0273531 A1 | 9/2014 | Niskanen et al. | |
| 2014/0302687 A1 | 10/2014 | Ashihara et al. | |
| 2015/0125591 A1 | 5/2015 | Hsieh et al. | |
| 2016/0013606 A1 | 1/2016 | Matsuda et al. | |
| 2016/0079054 A1 | 3/2016 | Chen et al. | |
| 2016/0148811 A1 | 5/2016 | Nakatani et al. | |
| 2016/0284542 A1 | 9/2016 | Noda et al. | |
| 2017/0365459 A1 | 12/2017 | Ohashi | |
| 2018/0204720 A1 | 7/2018 | Tanaka et al. | |
| 2018/0204742 A1 | 7/2018 | Tateno et al. | |
| 2023/0077197 A1 | 3/2023 | Tanaka et al. | |
| 2024/0096615 A1 * | 3/2024 | Tanaka | H01L 21/31 |

FOREIGN PATENT DOCUMENTS

| | | |
|---|---|---|
| JP | 2003-042442 A | 2/2003 |
| JP | 2004-138266 A | 5/2004 |
| JP | 2006-252246 A | 9/2006 |
| JP | 2006-324532 A | 11/2006 |
| JP | 2007-258307 A | 10/2007 |
| JP | 2009-123849 A | 6/2009 |
| JP | 2012-174717 A | 9/2012 |
| WO | 2013094680 A1 | 6/2013 |
| WO | 2016151684 A1 | 9/2016 |
| WO | 2017/056188 A1 | 4/2017 |

OTHER PUBLICATIONS

"Chapter 1: Computers and Industrial Control in E. A. Parr, Programmable Controllers, Third Edition: An Engineer's Guide," Elsevier, Ltd., 2003, pp. 1-32.
"Chapter 7: Industrial Control with Conventional Computers, Programmable Controllers, Third Edition: An Engineer's Guide," Elsevier, Ltd., 2003, pp. 276-292.
Japanese Office Action Issued Sep. 12, 2018, for Japanese Patent Application No. 2017-542555.

* cited by examiner

SUBSTRATE PROCESSING APPARATUS, PROCESSING METHOD, AND NON-TRANSITORY COMPUTER-READABLE RECORDING MEDIUM

CROSS-REFERENCE TO RELATED PATENT APPLICATION

This non-provisional U.S. patent application is a continuation of U.S. patent application Ser. No. 17/943,843, filed Sep. 13, 2022, which is a continuation of U.S. patent application Ser. No. 15/918,858, filed Mar. 12, 2018 and issued as U.S. Pat. No. 11,476,112, all of which are incorporated by reference as if fully set forth. This non-provisional U.S. patent application claims priority under 35 U.S.C. § 119 of International Patent Application No. PCT/JP2015/077502, filed on Sep. 29, 2015, the entire contents of which are hereby incorporated by reference.

BACKGROUND

1. Field

The present disclosure relates to a substrate processing apparatus.

2. Description of the Related Art

It is becoming more difficult to control interference between transistor devices due to leakage currents as the devices in a Large Scale Integrated circuit (hereinafter referred to as LSI) are miniaturized. The devices in the LSI are separated by forming voids such as grooves or holes in a silicon substrate and depositing an insulator in the voids. For example, an oxide film such as a silicon oxide film (SiO film) may be used as the insulator. The SiO film may be formed by oxidation of the silicon substrate, a chemical vapor deposition (CVD) method or a Spin-On-Dielectric (SOD) method.

Recently, with the miniaturization of devices, the technology of filling microstructures, especially filling deep or narrow voids with oxide, by the CVD method has reached its limit. In order to overcome the limits, a method of using an oxide having fluidity such as SOD ("SOD method") to fill the voids has been introduced. In the SOD method, an insulating coating material containing an inorganic component or an organic component called SOG (Spin-On-Glass) is used. The insulating coating material has been used in the manufacturing process of LSI before CVD oxide film was introduced. Since the manufacturing process of the LSI using the insulating coating material only requires 0.35 µm to 1 µm processes, the insulating coating material may be modified by performing the heat treatment at 400° C. under the nitrogen atmosphere. However, since latest manufacturing process of LSI such as DRAM (Dynamic Random Access Memory) and flash memory requires processes less than 50 nm processes, polysilazane ($SiH_2NH$) or PHPS (perhydropolysilazane) is used instead of SOG.

Polysilazane is a material obtained by catalytic reaction of dichlorosilane or trichlorosilane with ammonia, for example. A thin film may be formed by applying polysilazane on a substrate using a spin coater. The thickness of the coating film depends on the molecular weight and the viscosity of the polysilazane and the number of revolutions of the spin coater.

Polysilazane contains impurities such as nitrogen from ammonia used in the manufacturing process thereof. Therefore, it is necessary to remove impurities from the coating film (polysilazane film) by subjecting the polysilazane film to moisture and heat treatment after coating to obtain a dense oxide film. For example, moisture can be formed by reacting hydrogen and oxygen in a heat processing furnace to add moisture to the polysilazane film. The moisture permeates the polysilazane film and by heating the polysilazane film a dense oxide film is obtained. In case of STI (Shallow Trench Isolation), the maximum temperature of the heat treatment may be, for example, about 1,000° C.

While polysilazane has been widely used in LSI processes, it is necessary to reduce the thermal load of the transistor elements in order to prevent excessive diffusion of impurities such as boron, arsenic and phosphorus implanted in the transistor elements, to prevent the aggregation of metal silicide for electrode, to prevent the fluctuation of the performance of the work-function metal material for gate electrode, and to secure the number of read/write operations of the memory element. If moisture can be added efficiently, the thermal load can be easily reduced in the heat treatment performed after adding moisture.

Instead of filling the voids with insulator via the CVD method, the voids may be filled with insulator via a flowable CVD method.

In a substrate processing using a process gas, for example, in a process for obtaining a dense oxide film by modifying a polysilazane film coated by SOD or insulating material filled by a flowable CVD method, it is necessary to accurately acquire, monitor, and record the status of the substrate processing such as the progress of the substrate processing.

SUMMARY

Described herein is a technique capable of acquiring, monitoring and recording the progress of the reaction between a substrate and a reactive gas contained in a process gas in a process chamber during the processing of the substrate.

According to one aspect of the technique described herein, there is provided a substrate processing apparatus including: a process chamber capable of accommodating a substrate; a process gas supply system configured to supply a process gas into the process chamber via a process gas supply pipe; an exhaust pipe configured to exhaust an inner atmosphere of the process chamber; a sensor configured to be capable of detecting a first amount of the process gas which is an amount of the process gas in the process gas supply pipe or a second amount of the process gas which is an amount of the process gas contained in an exhaust gas in the exhaust pipe or detecting both of the first amount of the process gas and the second amount of the process gas; and a controller configured to be capable of performing: (a) controlling the process gas supply system to start a supply of the process gas into the process chamber at a predetermined flow rate; and (b) controlling the process gas supply system to reduce the predetermined flow rate into the process chamber or to stop the supply of the process gas into the process chamber when a third amount of the process gas which is an amount of the process gas consumed in the process chamber becomes equal to or lower than a predetermined value.

EMBODIMENT

Hereinafter, an embodiment will be described with reference to FIGS. 1 through 8.

(1) Configuration of Substrate Processing Apparatus

First, an example configuration of a substrate processing apparatus 10 in which a method of manufacturing a semiconductor device according to the embodiment is performed will be described with reference to FIGS. 1 and 2. The substrate processing apparatus 10 is a device for processing a wafer (silicon substrate) 200 using a process gas generated by vaporizing a liquid containing hydrogen peroxide ($H_2O_2$) or a hydrogen peroxide solution. Preferably, the substrate processing apparatus 10 is capable of processing the wafer 200 having a concave-convex microstructure such as grooves. Specifically, the microstructure refers to a structure of high aspect ratio such as narrow grooves (concave structure) having a width of about 10 nm to 50 nm, for example. According to the embodiment, an oxide film is formed by filling the grooves with a polysilazane film, which is a silicon-containing film, and processing the polysilazane film with a process gas. While the embodiment will be described by way of an example in which a polysilazane film is processed by a process gas, the technique described herein is not limited to the polysilazane film. The techniques described herein may also be applied, for example, to the treatment of films including silicon, nitrogen and hydrogen, particularly films containing silazane bonds and plasma polymerized films of tetrasilylamine and ammonia.

<Processing Vessel>

Figure 1:
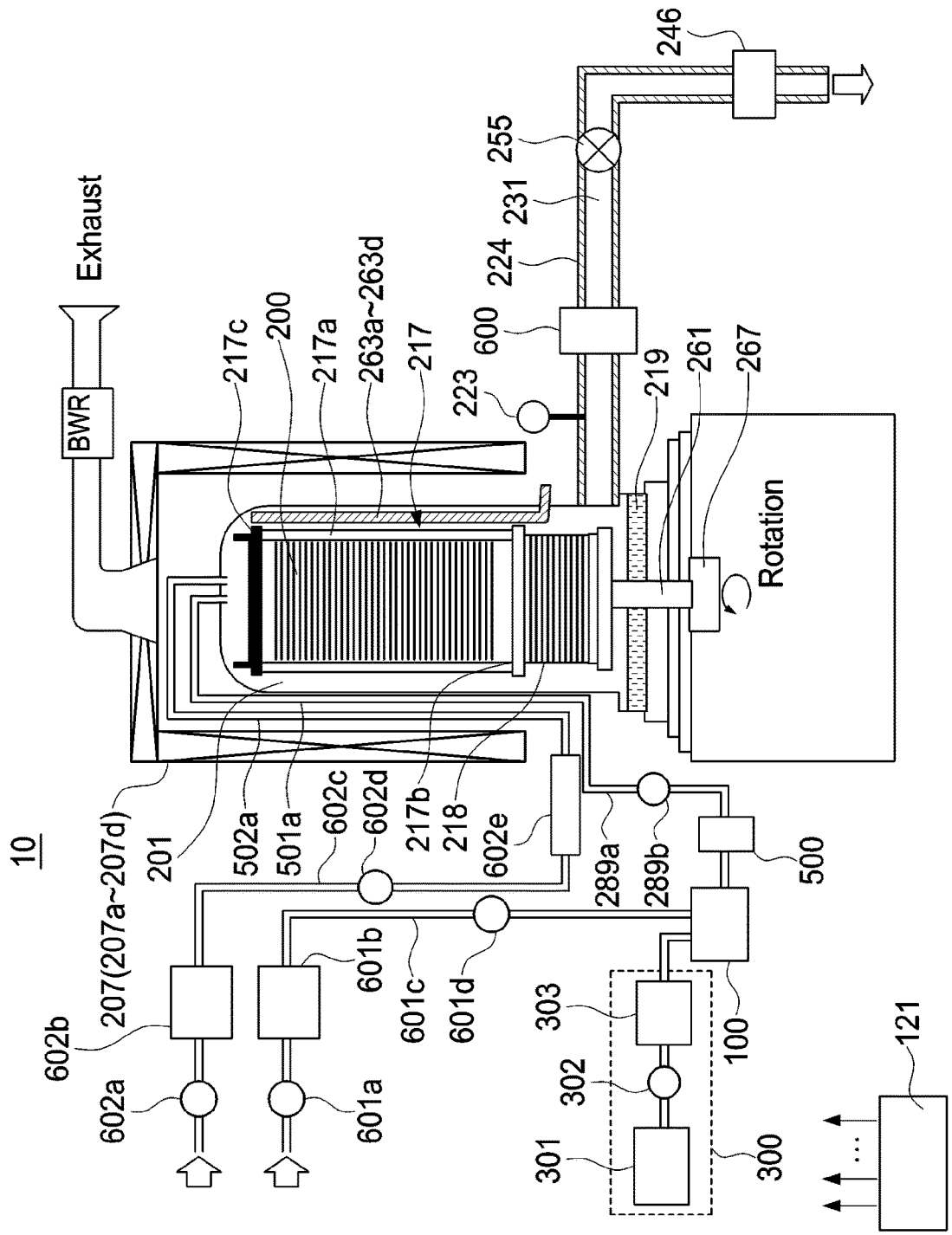
FIG. 1 schematically illustrates a vertical cross-section of a substrate processing apparatus according to an embodiment described herein.

As shown in FIG. 1, a processing furnace 202 includes a processing vessel (reaction tube) 203. The processing vessel 203 is made of a heat-resistant material such as quartz and silicon carbide (SiC), and is cylindrical with an open lower end. A process chamber 201 is provided in the hollow cylindrical portion of the processing vessel 203. The process chamber 201 is capable of accommodating wafers (substrates) 200 charged in a boat 217, which will be described later. The boat 217 supports concentrically arranged in vertical direction and horizontally oriented wafers 200.

A seal cap 219, which is a furnace opening cover capable of airtightly sealing the lower end opening (furnace opening) of the processing vessel 203, is provided under the processing vessel 203. The seal cap 219 is provided under the processing vessel 203 and is in contact with the lower end of the processing vessel 203. The seal cap 219 is disk-shaped. The process chamber 201, which is a processing space where the substrates are processed, is defined by the processing vessel 203 and the seal cap 219

<Substrate Retainer>

The boat (substrate retainer) 217 supports concentrically arranged wafers 200 in vertical direction while each of the wafers 200 are in horizontal orientation. The boat 217 includes a plurality of support columns 217a supporting the wafers 200. The number of the support columns 217a may be three, for example. The support columns 217a are provided between a bottom plate 217b and a top plate 217c. The support columns 217a support the concentrically arranged wafers 200 in multiple stages along the axis of the processing vessel 203. The diameter of the top plate 217c is greater than the diameter of each of the wafers 200.

The columns 217a, the bottom plate 217b and the top plate 217c are made of base metal having good thermal conductivity such as silicon carbide, aluminum oxide (AlO), aluminum nitride (AlN), silicon nitride (SiN) and zirconium oxide. Preferably, the columns 217a, bottom plate 217b and top plate 217c are made of base metal with a thermal conductivity of at least 10 W/mK. In the case where the thermal conductivity is of no importance, the columns 217a, the bottom plate 217b and the top plate 217c may be made of a material such as quartz. In case where the contamination of the wafer 200 by metal is of no importance, the columns 217a and the top plate 217c may be made of metal such as stainless steel (SUS). When the columns 217a and the top plate 217c are made of metal, a coating such as ceramic and Teflon (registered trademark) may be formed on the surface of the columns 217a and the top plate 217c.

An insulating body 218 is made of a heat-resistant material such as quartz and silicon carbide, and is provided under the boat 217. The insulating body 218 prevents heat radiated from a first heater 207 from reaching the seal cap 219. The insulating body 218 functions as a support body for supporting the boat 217 aw well as an insulating member. As shown in FIG. 2, the insulating body 218 may be embodied by a plurality of disc-shaped insulating plates in horizontal orientation in multiple stages. However, the insulating body 218 is not limited thereto. For example, the insulating body 218 may be cylindrical quartz cap. The insulating body 218 may be regarded as one of the members constituting the boat 217.

<Elevating Mechanism>

A boat elevator (not shown) is provided under the processing vessel 203. The boat elevator is an elevating mechanism that loads the boat 217 into the processing vessel 203 and unloads the boat 217 out of the processing vessel 203 by lifting and lowering the boat 217, respectively. When the boat 217 is elevated by the boat elevator, the seal cap 219 then airtightly closes the furnace opening.

A rotating mechanism 267 capable of rotating the boat 217 is provided at the seal cap 219 opposite to the process chamber 201. A rotating shaft 261 of the rotating mechanism 267 is coupled to the boat 217 through the seal cap 219. As the rotating mechanism 267 rotates the boat 217, the wafers 200 are rotated.

<First Heater>

A first heater 207 is provided outside the processing vessel 203 and concentrically arranged with the processing vessel 203. The first heater 207 is capable of heating the wafers 200 accommodated in the processing vessel 203. The first heater 207 is supported by a heater base 206. As shown in FIG. 2, the first heater 207 includes a first heating part 207a, a second heating part 207b, a third heating part 207c and a fourth heating part 207d. The first heating part 207a through the fourth heating part 207d are provided in the processing vessel 203 along the stacking direction of the wafers 200, respectively.

A first temperature sensor 263a, a second temperature sensor 263b, a third temperature sensor 263c and a fourth temperature sensors 263d are provided between the processing vessel 203 and the boat 217, respectively. The first temperature sensor 263a through the fourth temperature sensor 263d are provided for the first heating part 207a through the fourth heating part 207d, respectively. The first temperature sensor 263a through the fourth temperature sensor 263d measures the temperature of the wafer 200 or ambient temperature, and each of the first temperature sensor 263a through the fourth temperature sensor 263d includes, for example, a thermocouple. The first temperature sensor 263a through the fourth temperature sensor 263d is capable of measuring the temperatures of wafers 200 at the center of each of the groups of wafers 200 heated by the first heating part 207a through the fourth heating part 207d.

The first heater 207 and the first temperature sensor 263a through the fourth temperature sensor 263d are electrically connected to a controller 121 which will be described later. The controller 121 controls the energization states of the first heating part 207a through the fourth heating part 207d based on the temperatures measured by the first temperature sensor 263a through the fourth temperature sensor 263d such that the wafers 200 in the processing vessel 203 are at a predetermined temperature. In addition, the controller 121 is also capable of independently controlling the energization state or the temperature of each of the first heating part 207a through the fourth heating part 207d. A first external temperature sensor 264a, a second external temperature sensor 264b, a third external temperature sensor 264c and a fourth external temperature sensor 264d may be further provided at the first heating part 207a through the fourth heating part 207d, respectively. The first external temperature sensor 264a through the fourth external temperature sensor 264d measures the temperatures of the first heating part 207a through the fourth heating part 207d, respectively, and each of the first external temperature sensor 264a through the fourth external temperature sensor 264d includes, for example, a thermocouple. The first external temperature sensor 264a through the fourth external temperature sensor 264d are connected to the controller 121 such that the controller 121 is able to monitor the temperature of each of the first heating part 207a through the fourth heating part 207d via the first external temperature sensor 264a through the fourth external temperature sensor 264d.

<Gas Supply Mechanism (Gas Supply System)>

Figure 2:
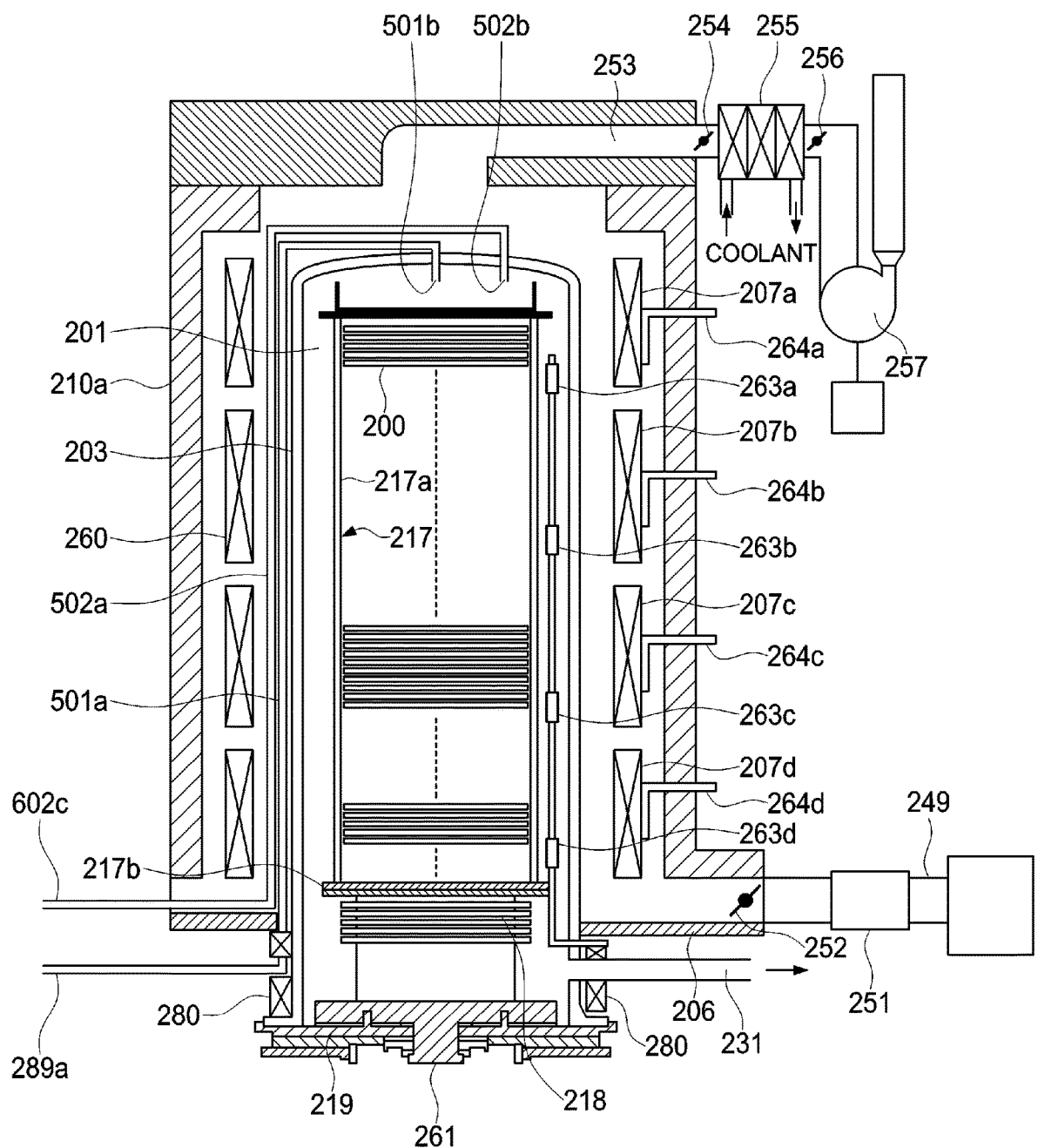
FIG. 2 schematically illustrates a vertical cross-section of a processing furnace of the substrate processing apparatus according to the embodiment.

As shown in FIGS. 1 and 2, a process gas supply nozzle 501a and an oxygen-containing gas supply nozzle 502a are provided between the processing vessel 203 and the first heater 207 along the outer sidewall of the processing vessel 203. For example, the process gas supply nozzle 501a and the oxygen-containing gas supply nozzle 502a are made of quartz which has a low thermal conductivity. The process gas supply nozzle 501a and the oxygen-containing gas supply nozzle 502a may have a double wall structure. Tips (downstream ends) of the process gas supply nozzle 501a and the oxygen-containing gas supply nozzle 502a are inserted into the processing vessel 203 through the ceiling of the processing vessel 203 in airtight manner. A supply hole 501b and a supply hole 502b are provided at the tips of the process gas supply nozzle 501a and the oxygen-containing gas supply nozzle 502a located in the processing vessel 203, respectively. A process gas and an oxygen-containing gas are supplied into the processing vessel 203 toward the top plate 217c provided at the top of the boat 217 accommodated in the processing vessel 203 through the supply hole 501b and the supply hole 502b, respectively.

A gas supply pipe 602c is connected to the upstream end of the oxygen-containing gas supply nozzle 502a. A valve 602a, a mass flow controller (MFC) 602b which is a flow rate controller, a valve 602d and a heater 602e capable of heating a gas are provided at the gas supply pipe 602c in order from the upstream side to the downstream side of the gas supply pipe 602c. For example, the oxygen-containing gas includes oxygen ($O_2$) gas, ozone ($O_3$) gas, nitrous oxide ($NO_2$) gas and combinations thereof. In the embodiment, $O_2$ gas is used as the oxygen-containing gas. The heater 602e is capable of heating the oxygen-containing gas to 80° C. to 150° C. It is preferable that the oxygen-containing gas is heated to 100° C. to 120° C. The heater 602e assists the heating of the process gas supplied into the process chamber 201 by heating the oxygen-containing gas. In addition, the re-liquefaction of the process gas in the processing vessel 203 may be suppressed. Further, the oxygen-containing gas may be heated by the first heater 207.

Instead of the oxygen-containing gas, a gas having low reactivity with the wafers 200 or the film formed on the wafers 200 may be supplied through the oxygen-containing gas supply nozzle 502a. For example, nitrogen ($N_2$) gas or rare gases such as argon (Ar) gas, helium (He) gas and neon (Ne) gas may be supplied through the oxygen-containing gas supply nozzle 502a. The process gas supply nozzle 501a and the oxygen-containing gas supply nozzle 502a extend along the inner sidewall to the top portion of the processing vessel 203, and lower ends of the process gas supply nozzle 501a and the oxygen-containing gas supply nozzle 502a penetrate the lower portion of the processing vessel 203 in airtight manner. At least one gas ejecting hole (gas supply hole) is provided either at the portion of the process gas supply nozzle 501a or the portion of the oxygen-containing gas supply nozzle 502a or both extending along the sidewall of the processing vessel 203. The gas may be supplied through the at least one gas ejecting hole (gas supply hole) parallel to the wafer 200.

Figure 5:
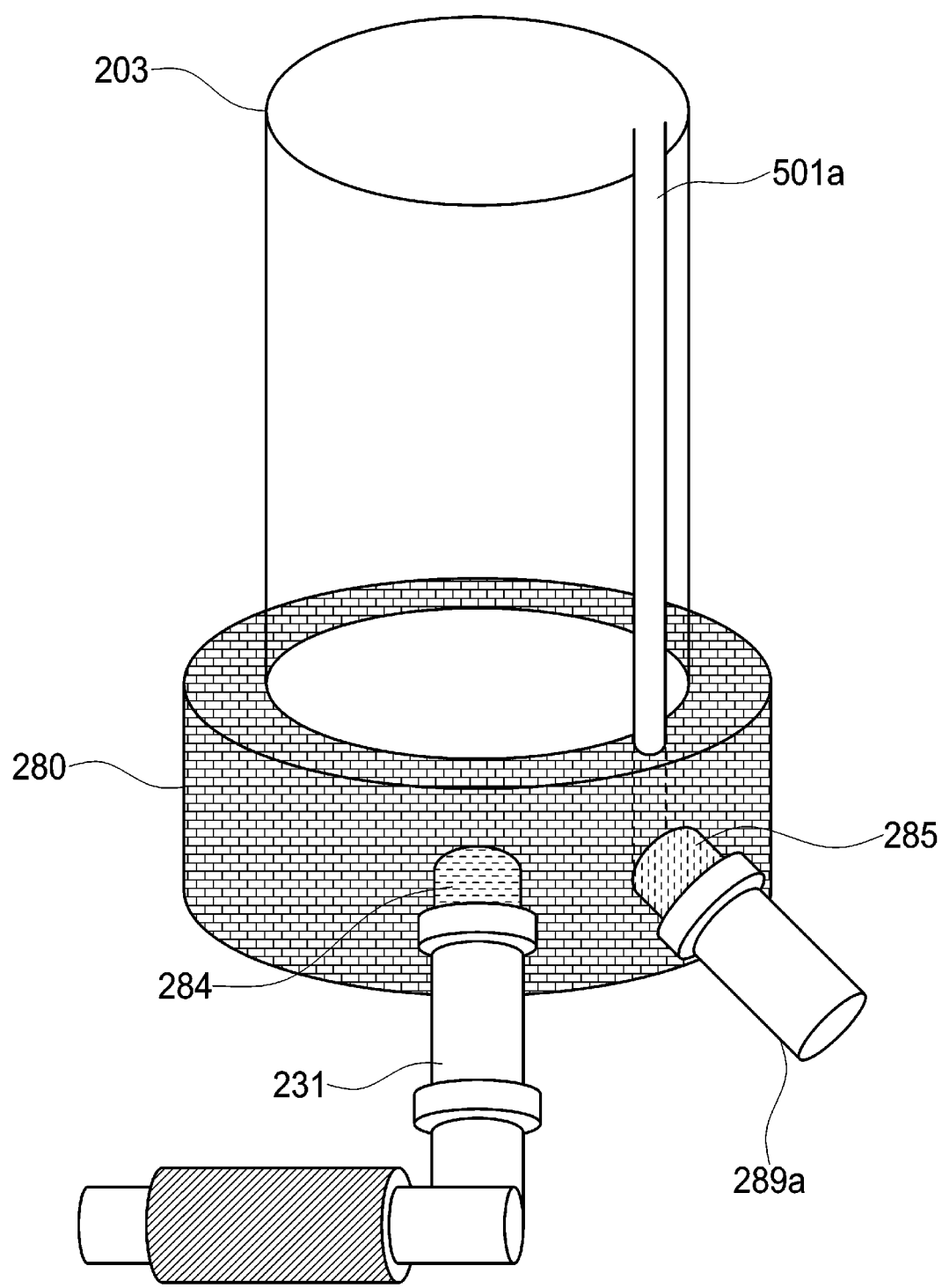
FIG. 5 schematically illustrates a furnace opening and surroundings thereof of the processing furnace of the substrate processing apparatus according to the embodiment.

A downstream end of a process gas supply pipe 289a for supplying the process gas is connected to the upstream end of the process gas supply nozzle 501a. A vaporizer 100, which is process gas generator capable of generating the process gas by vaporizing the liquid source, a gas concentration meter (gas concentration sensor) 500, a valve 289b and a gas port heater 285 are provided at the process gas supply pipe 289a in order from the upstream side to the downstream side of the process gas supply pipe 289a. According to the embodiment, a gas containing at least $H_2O_2$ gas is used as the process gas. A pipe heater (not shown) such as a jacket heater is provided around the process gas supply pipe 289a to heat the process gas supply pipe 289a. As shown in FIG. 5, the gas port heater 285 is provided at a connecting portion between the process gas supply nozzle 501a and the process gas supply pipe 289a, and is configured to heat the process gas passing through the connecting portion. In case the process gas supply nozzle 501a is inserted into the processing vessel 203 through the lower portion thereof, it is preferable that the gas port heater 285 is provided outside the processing vessel 203 whereat the process gas supply nozzle 501a is inserted.

A liquid source supply system (liquid source supply mechanism) 300 for supplying a liquid source (a liquid containing hydrogen peroxide) of the process gas to the vaporizer 100 and a carrier gas supply system (carrier gas supply mechanism) (not shown) are connected to the vaporizer 100.

The liquid source supply system 300 may include a liquid source supply 300, a valve and a liquid mass flow controller (LMFC) 300 for controlling the flow rate of the liquid source supplied to the vaporizer 100 provided in order from the upstream side to the downstream side of the liquid source supply system 300.

The carrier gas supply system may include a carrier gas supply pipe 601c, a carrier gas valve 601a, an MFC 601b which is a carrier gas flow rate controller and a carrier gas valve 601d. According to the embodiment, the oxygen-containing gas such as O2 gas may be used as the carrier gas. However, the oxygen-containing gas may include O3 gas), NO gas as well as O2 gas and combinations thereof which may be used as the carrier gas. Further, gases having low reactivity with the wafers 200 or films formed on the wafers 200 may be used as the carrier gas. For example, nitrogen (N2) gas or rare gases such as argon (Ar) gas, helium (He) gas and neon (Ne) gas may be used as the carrier gas.

According to the embodiment, the process gas supply nozzle 501a and the supply hole 501b constitute a process gas supply system. The process gas supply system may further include the process gas supply pipe 289a, the valve 289b, the gas concentration meter 500 and the vaporizer 100. The oxygen-containing gas supply nozzle 502a and the supply hole 502b constitute an oxygen-containing gas supply system. The oxygen-containing gas supply system may further include the gas supply pipe 602c, the heater 602e, the valve 602d, the MFC 602b and the valve 602a. The process gas supply system and the oxygen-containing gas supply system constitute the gas supply system (gas supply mechanism).

<Vaporizer>

Figure 3:
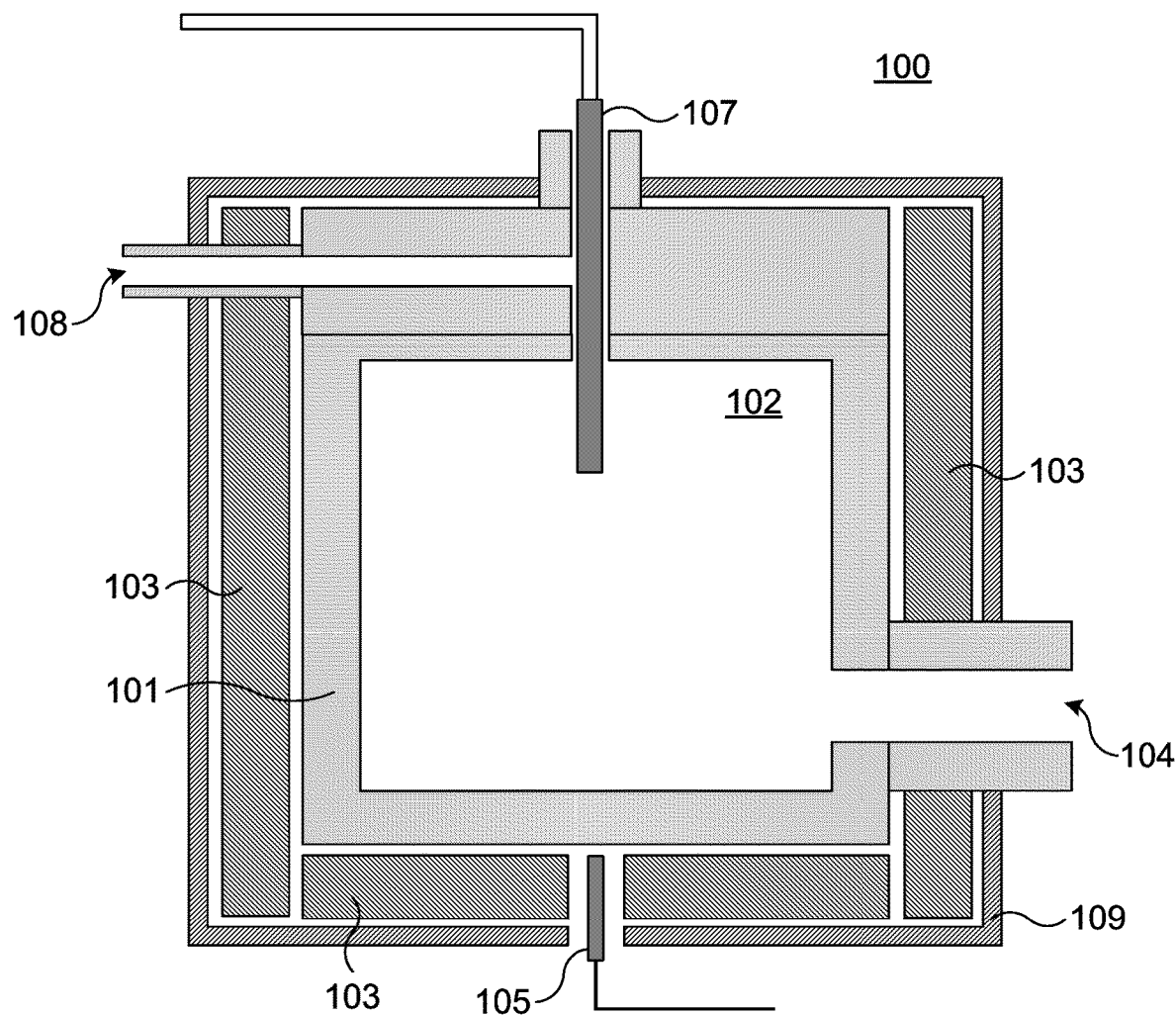
FIG. 3 schematically illustrates a vertical cross-section of a vaporizer of the substrate processing apparatus according to the embodiment.

FIG. 3 schematically illustrates a configuration of the vaporizer 100. The vaporizer 100 vaporizes the liquid source by dropping the liquid source onto a heated member. The vaporizer 100 includes: a vaporizer vessel 101 which is the heated member, and defines a vaporizing space 102; a vaporizer heater 103 for heating the vaporizer vessel 101; an outlet port 104 for exhausting (supplying) the gas obtained by vaporizing the liquid source to the process gas supply pipe 289a as a process gas; a thermocouple (temperature sensor) 105 for measuring the temperature of the vaporizer vessel 101; a temperature controller 106 for controlling the temperature of the vaporizer heater 103 based on the temperature measured by the thermocouple 105; a dripping nozzle 107 which is a liquid supply unit for supplying the hydrogen peroxide solution supplied from the LMFC 303 into the vaporizer vessel 101; and a carrier gas inlet port 108 for supplying a carrier gas supplied through the carrier gas supply pipe 601c into the vaporizer vessel 101.

The vaporizer vessel 101 is heated by the vaporizer heater 103 such that that the dripped liquid source is vaporized as it reaches the inner surface of the vaporizer vessel 101. A thermal insulator 109 may be provided to improve the efficiency of the vaporizer heater 103 heating the vaporizer vessel 101 or to insulate the vaporizer 100 and other components. In order to prevent the vaporizer vessel 101 from reacting with the liquid source, the vaporizer vessel 101 is made of a material such as quartz and SiC. The temperature of the vaporizer vessel 101 may be lowered by the temperature or vaporization heat of the dripped liquid source. Therefore, it is preferable that the vaporizer vessel 101 is made of a material having a high thermal conductivity such as SiC in order to minimize the temperature fluctuation of the vaporizer vessel 101.

According to the embodiment, a liquid source which is a mixture of two or more sources having different boiling points such as a hydrogen peroxide solution are heated and vaporized by the vaporizer 100. Even when the liquid source is heated to a temperature higher than the boiling point of the liquid source, one of the one or more sources having a lower boiling point may be vaporized first and the rest of the one or more sources having higher boiling points may not be vaporized unless the liquid source is uniformly heated. As a result, the concentration ratio among the one or more sources in the vaporized gas may not be uniform since the rest of the one or more sources having higher boiling points may be concentrated in the liquid source.

More specifically, the hydrogen peroxide solution is the mixture of $H_2O_2$ and $H_2O$. Therefore, the boiling point of the hydrogen peroxide solution depends on the concentration of $H_2O_2$. For example, the boiling point of pure hydrogen peroxide ($H_2O_2$ concentration of 100%) is about 150° C. under atmospheric pressure, and the boiling point of a hydrogen peroxide solution with a $H_2O_2$ concentration of 34% is about 106° C. under atmospheric pressure. Therefore, when the hydrogen peroxide solution supplied to the vaporizer vessel 101 is vaporized, the water ($H_2O$) in the hydrogen peroxide solution is first vaporized unless the vaporizer vessel 101 is uniformly heated. As a result, $H_2O_2$ may be concentrated in the hydrogen peroxide solution.

Therefore, according to the embodiment, by rapidly heating the entire hydrogen peroxide solution on the heating surface of the vaporizer vessel 100 to a temperature higher than the boiling point of the hydrogen peroxide solution having a boiling point higher than water, the concentration of hydrogen peroxide is suppressed. More specifically, for example, when vaporizing a hydrogen peroxide solution with a $H_2O_2$ concentration of 34%, the vaporizer heater 103 heats the vaporizer vessel 101 to a temperature higher than the boiling point of the hydrogen peroxide solution. By dripping the hydrogen peroxide solution onto the heated surface of the vaporizer vessel 101, the droplets of the hydrogen peroxide solution are rapidly heated and vaporized at a temperature higher than 106° C. The vaporizer heater 103 is capable of heating the vaporizer vessel 101 to a temperature higher than the boiling point of 150° C. of pure hydrogen peroxide with a $H_2O_2$ concentration of 100% such that $H_2O_2$ in hydrogen peroxide solution is prevented from concentrating when vaporized.

However, the decomposition of $H_2O_2$ is accelerated as the heating temperature rises. Therefore, it is necessary for the hydrogen peroxide solution to be heated to as low a temperature as possible while also preventing $H_2O_2$ from concentrating. In particular, $H_2O_2$ decomposes rapidly when the temperature exceeds 150° C. Thus, according to the embodiment, the temperature of the vaporization heater 103 is controlled to a temperature as high as the boiling point of the hydrogen peroxide solution of a predetermined concentration, but as low as possible to prevent the concentration of $H_2O_2$.

<Exhaust System>

Figure 6:
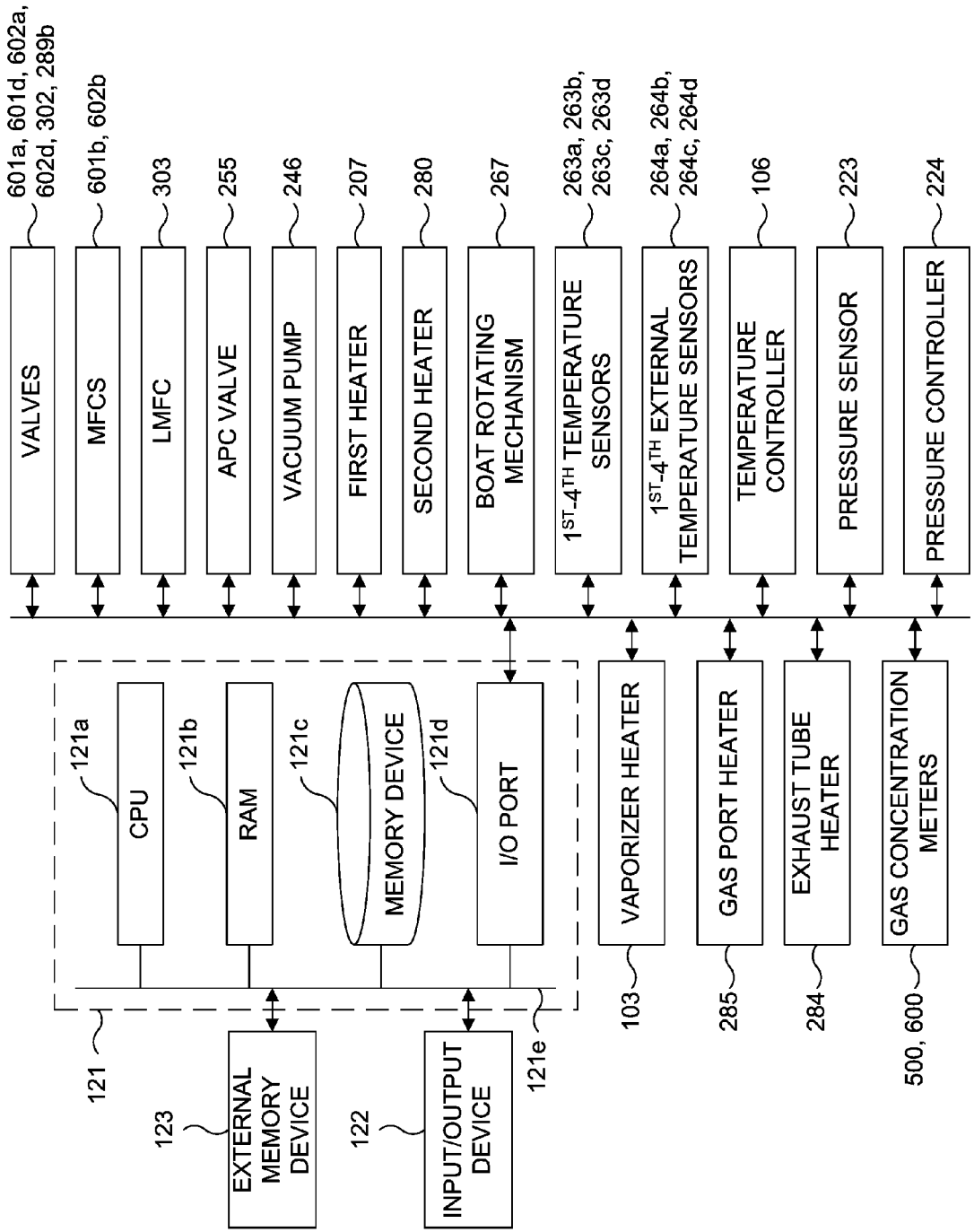
FIG. 6 schematically illustrates a configuration of a controller of the substrate processing apparatus and peripherals thereof according to the embodiment.

One end of a gas exhaust pipe 231 for exhausting the inner atmosphere of the process chamber 201 is connected to the lower sidewall of the processing vessel 203. A vacuum pump, which is a vacuum exhausting device, is connected to the other end of the gas exhaust pipe 231 via a gas concentration meter (gas concentration sensor) 600 and an APC (Automatic Pressure Controller) valve 255 which is a pressure controlling device. The inner atmosphere of the process chamber 201 is exhausted by way of generating negative pressure by a vacuum pump 246. The APC valve 255 may be opened or closed to vacuum-exhausting the process chamber 201 or stop the vacuum exhaust. The opening degree of the APC valve 255 may be adjusted in order to control the inner pressure of the process chamber 201. A pressure sensor 223, which is a pressure detector, is provided at the upstream side of the APC valve 255. The inner pressure of the process chamber 201 may be exhausted to a predetermined pressure (vacuum level) by using above-described components. A pressure controller 224 shown in FIG. 6 is electrically connected to the pressure sensor 223 and the APC valve 255. The pressure controller 224 controls the operation of the APC valve 255 such that the inner pressure of the process chamber 201 is adjusted to a desired level at a desired timing based on the pressure detected by the pressure sensor 223.

The gas exhaust pipe 231 and the APC valve 255 constitute the exhaust system. The exhaust system may further include the gas concentration meter 600 and the pressure sensor 223. The exhaust system may further include the vacuum pump 246.

<Gas Concentration Meter (Gas Concentration Sensor)>

The gas concentration meter 500 is provided at the process gas supply pipe 289a. The gas concentration meter 500 measures (detects) the concentration of the process gas flowing in the process gas supply pipe 289a supplied from the vaporizer 100. The gas concentration meter 600 is provided at the gas exhaust pipe 231. The gas concentration meter 600 measures (detects) the concentration of the exhaust gas flowing in the gas exhaust pipe 231 which is exhausted from the process chamber 201. In the embodiment, the concentrations of the gases measured by the gas concentration meters 500 and 600 refer to the concentrations of certain gases contained in the process gas and the exhaust gas, respectively. For example, the certain gases include a reactive gas contained in the process gas for processing the wafers 200 such as $H_2O_2$ gas for oxidizing the silicon-containing film formed on the wafers 200. That is, the gas concentration meter 500 measures (detects) the concentration of the $H_2O_2$ gas contained in the process gas and the gas concentration meter 600 measures (detects) the concentration of the $H_2O_2$ gas contained in the exhaust gas.

Figure 4A:
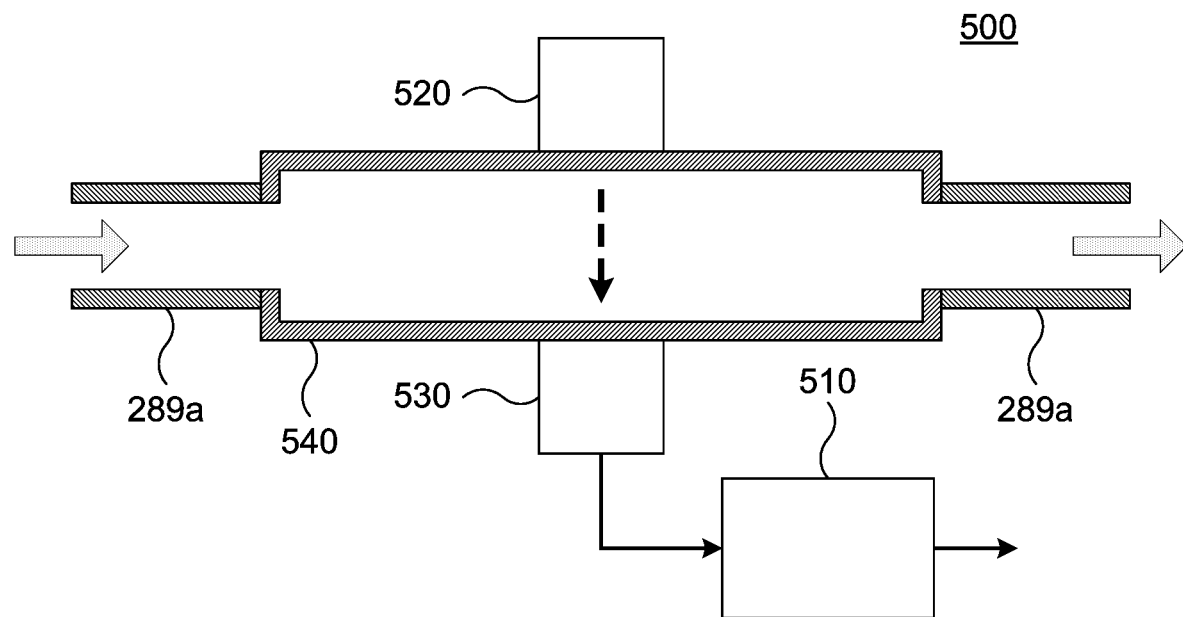
FIG. 4A schematically illustrates a vertical cross-section of a first gas concentration meter of the substrate processing apparatus according to the embodiment.
Figure 4B:
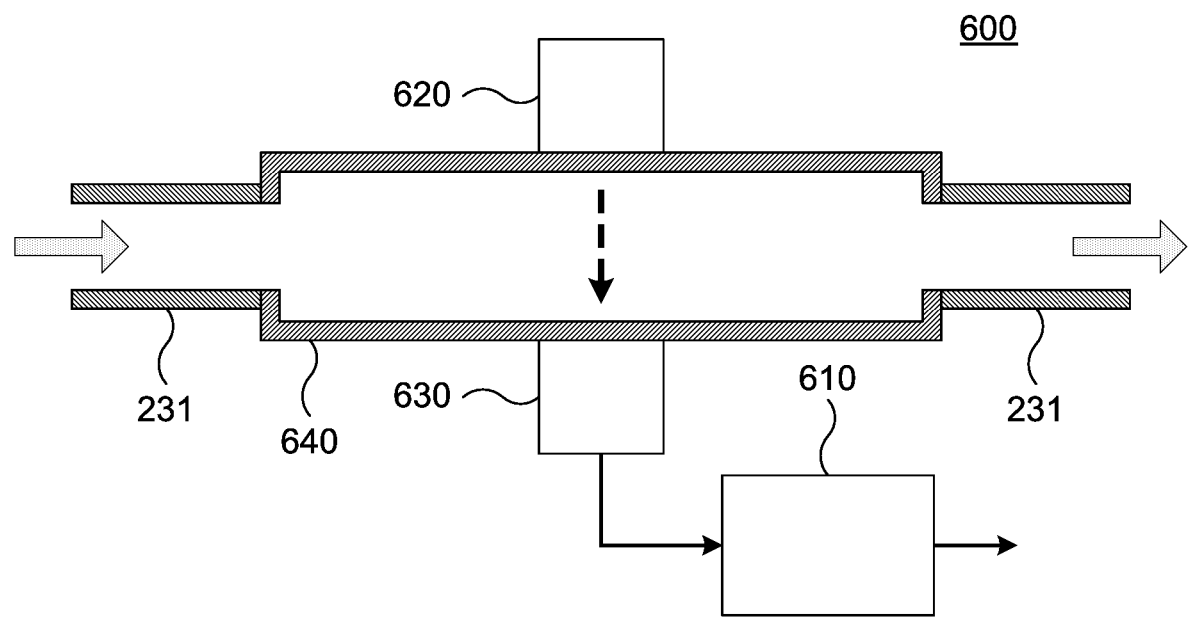
FIG. 4B schematically illustrates a vertical cross-section of a second gas concentration meter of the substrate processing apparatus according to the embodiment.

As shown in FIG. 4A, the gas concentration meter 500 includes a cell 540 through which the process gas supplied via a process gas supply pipe 289a passes; a light emitter 520 for irradiating a light beam, particularly a near-infrared ray, to the process gas passing through the cell 540; a light receiver 530 for receiving the light beam irradiated from the light emitter 520 and passed through the process gas in the cell 540; and an analyzer (gas concentration calculator) 510 for analyzing the spectrum of the light beam received by the light receiver 530 and calculating the concentration of $H_2O_2$ in the process gas. Similarly, as shown in FIG. 4A, the gas concentration meter 600 includes a cell 640 through which the exhaust gas supplied via the gas exhaust pipe 231 passes; a light emitter 620 for irradiating a light beam, particularly a near-infrared ray, to the exhaust gas passing through the cell 640; a light receiver 630 for receiving the light beam irradiated from the light emitter 620 and passed through the exhaust gas in the cell 640; and an analyzer (gas concentration calculator) 610 for analyzing the spectrum of the light beam received by the light receiver 630 and calculating the concentration of $H_2O_2$ in the exhaust gas. The analyzers 510 and 610 are connected to the light receivers 530 and 630, respectively, via, for example, optical fibers, and analyze the spectrum of the light beam received by the light receivers 530 and 630. The analyzers 510 and 610 the concentrations of $H_2O_2$ in the process gas and exhaust gas, respectively, by evaluating the magnitudes of the unique spectral component of the light beam passed through the process gas or exhaust gas containing the $H_2O_2$ in the cells 540 and 640. The concentration data of the $H_2O_2$ calculated by the analyzers 510 and 610 are transmitted to the controller 121. Although the analyzers 510 and 610 according to the embodiment are described as calculating the concentration of the $H_2O_2$, the analyzers 510 and 610 may calculate other data representing the concentration of the $H_2O_2$ rather than the concentration of the gas itself <Second Heater>

When a gas containing $H_2O_2$ (reactive material) obtained by vaporizing a hydrogen peroxide solution (aqueous solution containing $H_2O_2$) or by converting the hydrogen peroxide solution into mist state is used as the process gas, it is possible that the gas containing $H_2O_2$ is cooled down to a temperature lower than the boiling point of $H_2O_2$ in the processing vessel 203, resulting in the re-liquefaction of $H_2O_2$ or the re-liquefaction of gas containing $H_2O_2$.

Specifically, the re-liquefaction of the gas containing $H_2O_2$ may occur in a region of the processing vessel 203 other than the region of the processing vessel 203 heated by the first heater 207. As described above, the first heater 207 heats the region of the processing vessel 203 in which the wafer 200 is present since the first heater 207 is provided to heat the wafer 200 in the processing vessel 203. However, the region other than where the wafer 200 is present may not be adequately heated by the first heater 207. As a result, the region other than the region heated by the first heater 207 may be a low temperature region in which the gas containing $H_2O_2$ may be cooled and re-liquefied when passing through.

The liquid from the re-liquefaction of the gas containing the $H_2O_2$ may remain at the bottom of the processing vessel 203 (the upper surface of the seal cap 219), which may result in a chemical reaction between the liquid and the seal cap 219 to damage the seal cap 219. The liquid remaining on the seal cap 219 may also flow out of the processing vessel 203 through the furnace opening (the opening at the lower end of the processing vessel 203) when the seal cap 219 is lowered to open the furnace opening of the processing vessel 203 in order to unload the boat 217 from the processing vessel 203. As a result, the members around the furnace opening of the processing furnace 202 may be also damaged and the safety of the operator around the processing furnace 202 cannot be secured.

The liquid from the re-liquefaction of the gas containing the $H_2O_2$ may have higher $H_2O_2$ concentration than the hydrogen peroxide solution supplied into the processing vessel 203. The liquid from the re-liquefaction of the gas containing the $H_2O_2$ may be re-vaporized in the processing vessel 203. As described above, since the boiling point of $H_2O_2$ differs from that of $H_2O$, and $H_2O$ is first vaporized, the gas produced by re-vaporization may have higher $H_2O_2$ concentration than the gas supplied into the processing vessel 203.

Thus, the $H_2O_2$ concentration of the gas produced by re-vaporization and the concentration of the gas containing the $H_2O_2$ supplied into the processing vessel 203 may not be uniform. As a result, the substrate processing may not be uniform among the wafers 200 in the processing vessel 203, and the characteristics of the substrate processing may deviate for each wafer 200. In addition, the substrate processing may deviate for each lot of wafers 200. Moreover, as the re-liquefaction and re-vaporization of $H_2O_2$ are repeated, the concentration of $H_2O_2$ may become higher. As a result, the possibility of explosion or combustion may increase.

In order to solve the above-described problems, a second heater 280 is provided in the processing furnace 202 as shown in FIGS. 2 and 5. The second heater 280 is capable of heating the region other than the region heated by the first heater 207. That is, the second heater 280 is provided concentric with the processing vessel 203 to surround the outer side surface (outer periphery) of the lower portion (around the furnace opening portion) of the processing vessel 203.

The second heater 280 is capable of heating the gas containing $H_2O_2$, which flows from the upstream side to the downstream side of the processing vessel 203 toward the exhaust unit, at the lower region of the processing vessel 203 where the insulating body 218 is provided. The second heater 280 is also capable of heating members in the lower region of the processing vessel 203 such as the seal cap 219 for sealing the lower end opening of the processing vessel 203 and the insulating body 218 provided at the bottom of the processing vessel 203. The second heater 280 is provided lower than the bottom plate 217b when the boat 217 is loaded into the process chamber 201. The second heater 280 may be embodied by a lamp heater, for example.

The controller 121, which will be described later, is electrically connected to the second heater 280. The controller 121 controls the energization state of the second heater 280 at a predetermined timing such that the inner temperature of the processing vessel 203 is at a temperature (e.g., 100° C. to 300° C.) high enough to suppress liquefaction of the process gas (i.e., the gas including $H_2O_2$). The second heater 280 continues to heat the furnace opening of the processing vessel 203 at least during the supply of the process gas into the processing vessel 203. Preferably, the second heater 280 continues to heat the furnace opening of the processing vessel 203 from the loading of the wafer 200 into the processing vessel 203 until the unloading of the wafer 200 from the processing vessel 203. As a result, the re-liquefaction of the process gas at the furnace opening and attachment of particles and impurities generated in drying process, which will be described later, to the furnace opening may be prevented. By starting to heat the furnace opening by the second heater 280 after the wafer 200 is loaded, the time required to prepare for the pre-processing before the supply of the process gas is shortened.

As described above, the gas port heater 285 is provided at the connecting portion between the process gas supply nozzle 501a and the process gas supply pipe 289a. The gas port heater 285 is capable of heating the process gas passing through the connecting portion. The gas port heater 285 is controlled to be at a desired temperature such that condensation does not occur in the process gas supply pipe 289a. For example, the gas port heater 285 is controlled to be at a temperature ranging from 50° C. to 300° C. An exhaust tube heater 284 is provided at the connecting part between the gas exhaust pipe 231 and the processing vessel 203. The exhaust tube heater 284 is controlled to be at a desired temperature such that condensation does not occur in the gas exhaust pipe 231. Preferably, the exhaust tube heater 284 is controlled to be at a temperature ranging from 50° C. to 300° C.

<Controller>

As shown in FIG. 6, the controller 121, which is a control device (control means), may be embodied by a computer having a CPU (Central Processing Unit) 121a, a RAM (Random Access Memory) 121b, a memory device 121c and an I/O port 121d. The RAM 121b, the memory device 121c and the I/O port 121d may exchange data with the CPU 121a via an internal bus 121e. An input/output device 121 such as a touch panel and a display device may be connected to the controller 121.

The memory device 121c may be embodied by components such as flash memory and HDD (Hard Disk Drive). A control program for controlling the operation of the substrate processing apparatus 10 and a process recipe in which information such as the order and condition of the substrate processing which will be described later is stored are readably stored in the memory device 121c. The process recipe is a program that is executed in the controller 121 to obtain a predetermined result by performing sequences of the substrate processing. Hereinafter, the process recipe and the control program are collectively referred to simply as a program. The term "program" may refer to only the process recipe, only the control program, or both. The RAM 121b is a work area in which the program or the data such as the calculation data and the processing data read by the CPU 121a are temporarily stored.

The I/O port 121d is electrically connected to the components such as the LMFC 303, the MFCs 601b and 602b, the valves 601a, 601d, 602a, 602d, 302 and 289b, the APC valve 255, the first heater 207 (the first heating part 207a through the fourth heating part 207d), the second heater 280, the first temperature sensor 263a through the fourth temperature sensor 263d, the rotating mechanism 267, the pressure sensor 223, the temperature controller 106, the gas concentration meters 500 and 600, and the pipe heater (not shown).

The CPU 121a is configured to read and execute the control program stored in the memory device 121c, and read the process recipe stored in the memory device 121c in accordance with an instruction such as an operation command inputted via the input/output device 122. The CPU 260a may be configured to control operation of the substrate processing apparatus 10 according to the process recipe. For example, the CPU 260a may be configured to perform operation such as a flow rate adjusting operation of the LMFC 303 for the liquid source, flow rate adjusting operations of the MFCs 601a and 601b for various gases, opening/closing operations of the valves 601a, 601d, 602a, 602d, 302 and 289b, an opening/closing operation of the APC valve 255, a temperature adjusting operation of the first heater 207 based on the temperatures measured by the first temperature sensor 263a through the fourth temperature sensor 263d, a temperature adjusting operation of the second heater 280, a start and stop of the vacuum pump 246, a rotation speed adjusting operation of the boat rotating mechanism 267, a temperature adjusting operation of the vaporizer heater via the temperature controller 106, and a temperature adjusting operation of the pipe heater. The CPU 260a may be configured to analyze gas concentration data obtained by the gas concentration meters 500 and 600, which will be described later.

The controller 121 may be embodied by installing the above-described program stored in an external memory device 123 to a computer. The external memory device 123 may include a magnetic tape, a magnetic disk such as a flexible disk and a hard disk, an optical disk such as CD and DVD, a magneto-optical disk such as MO, and a semiconductor memory such as a USB memory and a memory card. The memory device 121c or the external memory device 123 may be embodied by a non-transitory computer readable recording medium. Hereafter, the memory device 121c and the external memory device 123 are collectively referred to as recording media. Herein, "recording media" may refer to only the memory device 121c, only the external memory device 123, or both. In addition to the external memory device 123, a communication network such as the Internet and dedicated line may be used as the means for providing the program to the computer.

(2) Pre-Processing

Figure 7:
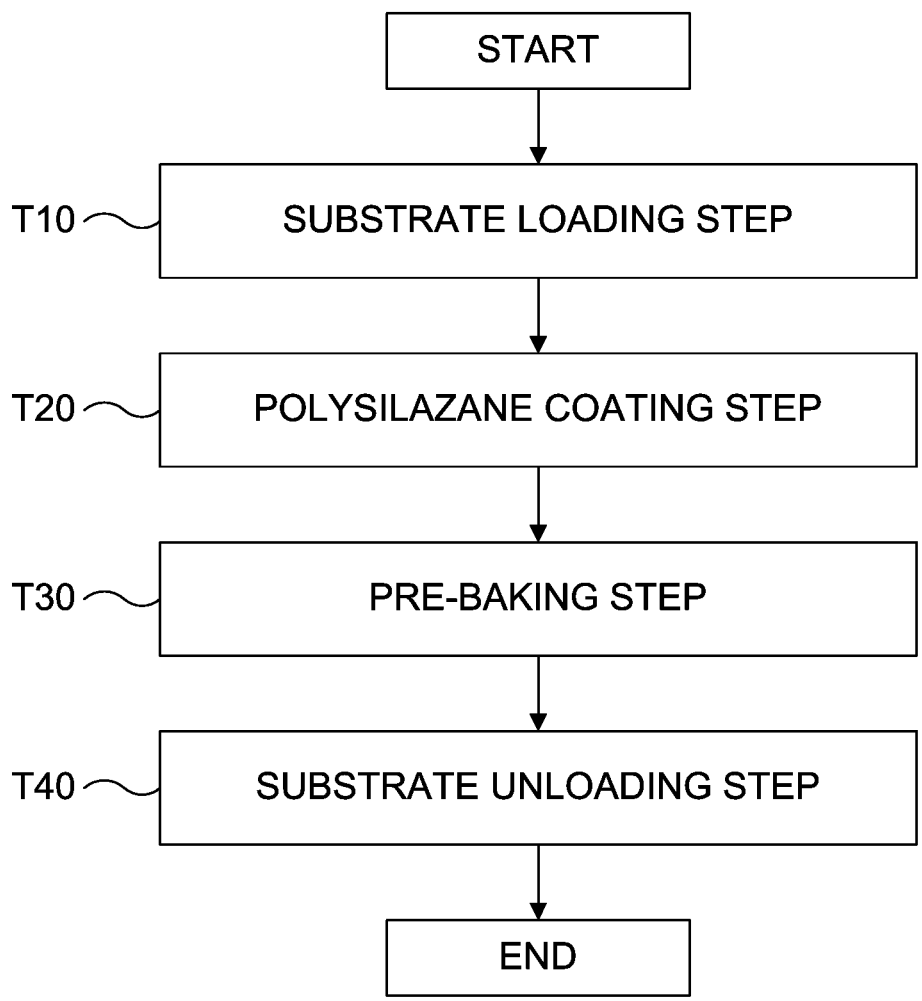
FIG. 7 is a flowchart illustrating a pre-processing performed before a substrate processing according to the embodiment.

Hereinafter, the pre-processing performed before the modifying step of the wafer (substrate) 200 will be described with reference to FIG. 7. As shown in FIG. 7, the pre-processing includes: a polysilazane coating step T20 wherein polysilazane is coated on the wafer 200; and a pre-baking step T30. According to the polysilazane coating step T20, the polysilazane is applied by a spin coater (not shown). The thickness of the coated polysilazane is determined by the conditions such as the molecular weight of the polysilazane, the viscosity of the polysilazane solution and the number of revolutions of the spin coater. According to the pre-baking step T30, the solvent is removed from the polysilazane coated on the wafer 200. Specifically, the solvent is volatilized by heating the polysilazane coated on the wafer 200 to a temperature of from about 70° C. to 250° C. Preferably, the polysilazane coated on the wafer 200 is heated to about 150° C.

The wafer 200 used in the pre-processing has a concave-convex microstructure. The applied polysilazane fills at least the grooves of the concave-convex structure. That is, polysilazane coating film, which is a silicon-containing film, is formed in the grooves of the wafer (substrate) 200. Hereinafter, an example wherein a gas containing $H_2O_2$, which is obtained by vaporizing a hydrogen peroxide solution, is used as a process gas will be described. The silicon-containing film is a film containing, for example, silicon, nitrogen and hydrogen. The silicon-containing film may also contain carbon or other impurities. "Microstructure" refers to a structure with a high aspect ratio such as deep grooves or narrow grooves of about 10 nm to 30 nm formed on a silicon substrate, for example.

In the pre-processing according to the embodiment, the wafer 200 is loaded (substrate loading process, T10) into a processing apparatus (not shown) which is different from the substrate processing apparatus 10 described above, and the polysilazane coating step T20 and the pre-baking step T30 are performed in the processing apparatus. The wafer 200 is unloaded (substrate take-out step, T40) from the processing apparatus. However, in the pre-processing, the polysilazane coating step T20 and the pre-baking step T30 may be performed by two separate apparatuses.

(3) Substrate Processing

Figure 8:
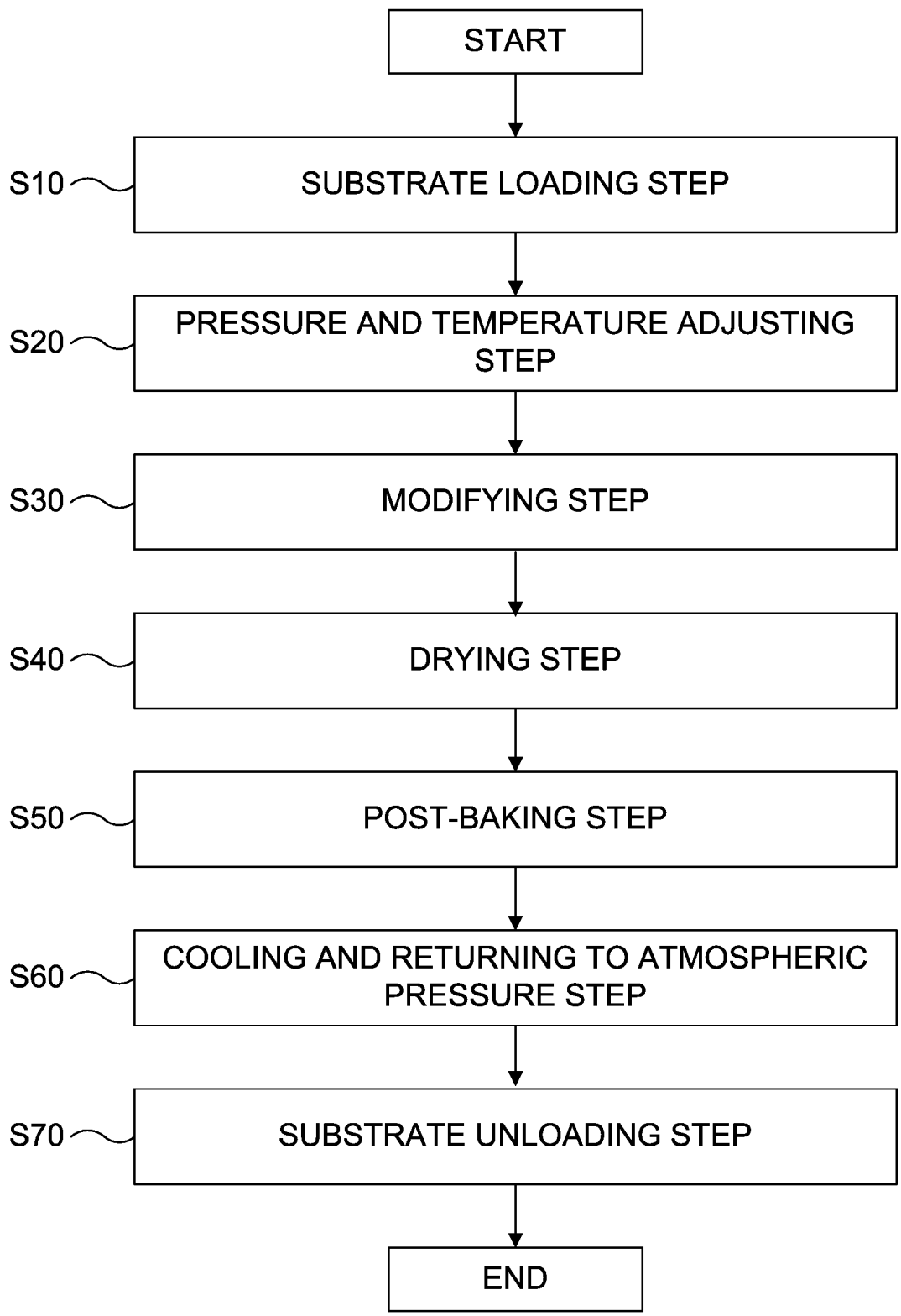
FIG. 8 is a flowchart illustrating the substrate processing according to the embodiment.

Next, an exemplary sequence of the substrate processing for manufacturing a semiconductor device will be described with reference to FIG. 8. A modifying step according to the embodiment wherein a silicon-containing film formed on the wafer (substrate) 200 is modified into an SiO film using a process gas containing $H_2O_2$ will be described. Herein, the components of the substrate processing apparatus 10 are controlled by the controller 121.

Since hydrogen peroxide ($H_2O_2$) has higher activation energy and has more oxygen atoms in one molecule than water vapor ($H_2O$), hydrogen peroxide ($H_2O_2$) is stronger oxidant than water vapor ($H_2O$). Therefore, by using a gas containing $H_2O_2$ as the process gas, the oxygen atoms can reach the film formed at the bottoms of the grooves of the wafer 200. As a result, the modification step may be performed more uniformly between the convex portion of the film and concave portion of the film at the bottom of the grooves of the wafer 200. As a result, the dielectric constant of the wafer 200 after the modifying step is more uniform. Since the modifying step may be performed at a low temperature, problems such as deterioration of the performance of the circuit formed on the wafer 200 may be suppressed. According to the embodiment, the reactant $H_2O_2$ vaporized or converted to be in mist state ($H_2O_2$ in the gaseous phase) is referred to as a "$H_2O_2$ gas" or a "reactive gas" and a gas containing at least $H_2O_2$ gas is referred to as "process gas." An aqueous solution of $H_2O_2$ is referred to as "hydrogen peroxide solution" or "liquid source."

<Substrate Loading Step S10>

First, a predetermined number of wafers 200 are charged into the boat 217 (wafer charging). The boat 217 holding the wafers 200 is elevated by the boat elevator and loaded into the processing vessel 203 (into the process chamber 201) (boat loading). With the boat 217 loaded, the seal cap 219 seals the lower end opening (furnace opening) of the processing furnace 202.

<Pressure and Temperature Adjusting Step S20>

The vacuum pump 246 vacuum-exhausts the processing vessel 203 such that the inner pressure of the processing vessel 203 is adjusted to a desired pressure (vacuum level). The oxygen-containing gas is supplied into the processing vessel 203 via the supply hole 501*b* of the oxygen-containing gas supply system. Preferably, the oxygen-containing gas is supplied into the processing vessel 203 after being heated to a temperature ranging from 100° C. to 120° C. by the heater 602*e*. At this time, the inner pressure of the processing vessel 203 is measured by the pressure sensor 223, and the opening degree of the APC valve 255 is feedback-controlled based on the measured pressure (pressure adjusting). Preferably, the inner pressure of the processing vessel 203 is adjusted such that the processing vessel 203 is not depressurized, for example, to a pressure ranging from 700 hPa to 1,000 hPa.

The first heater 207 heats the processing vessel 203 such that the temperature of the wafers 200 in the processing vessel 203 is adjusted to a desired first temperature ranging from 40° C. to 100° C., for example. The energization states of the first heating part 207*a* through the fourth heating part 207*d* of the first heater 207 are feedback-controlled based on the temperature measured by the first temperature sensor 263*a* through the fourth temperature sensor 263*d*, respectively, such that the wafers 200 in the processing vessel 203 are at the first temperature (temperature adjusting). The first heating part 207*a* through the fourth heating part 207*d* are controlled such that the temperatures of the first heating part 207*a* through the fourth heating part 207*d* are the same. The second heater 208 is controlled to adjust the inner temperature of the processing vessel 203 such that the process gas is not re-liquefied in the processing vessel 203, particularly in the lower portion of the processing vessel 203. Preferably, the second heater 208 heats the lower portion of the processing vessel 203 to a temperature ranging from 100° C. to 200° C.

The rotating mechanism 267 starts to rotate the boat 217 and the wafers 200 while the wafers 200 are heated. The rotation speed of the boat 217 is controlled by the controller 121. The rotating mechanism 267 continuously rotates the boat 217 until at least the modifying step S30, which will be described later, is complete.

<Modifying Step S30>

When the wafer 200 is heated to a first temperature, and the boat 217 is rotated at a predetermined speed, the liquid source (hydrogen peroxide solution) is supplied to the vaporizer 100 by the liquid source supply system 300. Specifically, the flow rate of the liquid source supplied by the liquid source supply system 300 is adjusted by the LMFC 303. After the flow rate of the liquid source is adjusted, the liquid source is supplied into the vaporizer vessel 101 of the vaporizer 100 via the dripping nozzle 107 by opening the valve 302. The liquid source supplied to the vaporizer 100 is dropped onto the inner bottom surface of the vaporizer vessel 101 through the dripping nozzle 107. Since the vaporizer vessel 101 is heated by the vaporizer heater 103 to a desired temperature (for example, 150° C. to 170° C.), the droplets of the liquid source (hydrogen peroxide solution) that comes in contact with the inner bottom surface of the vaporizer vessel 101 is instantaneously heated and evaporated to a gas.

The process gas, which is the gas obtained from the liquid source by vaporization, is supplied to the wafers in the process chamber by opening the valve 289b via the exhaust port 104, the process gas supply pipe 289a, the valve 289b, the process gas supply nozzle 501a, and the supply hole 501b of the process gas supply nozzle 501a. The $H_2O_2$ gas contained in the process gas acts as a reactive gas. The $H_2O_2$ gas contained in the process gas reacts with the silicon-containing film on the wafer to modify (oxidize) the silicon-containing film, thereby forming a SiO film.

With the process gas being supplied into the processing vessel 203, the inner atmosphere of the processing vessel 203 is exhausted by the vacuum pump 246. Specifically, the APC valve 255 is opened and the vacuum pump 246 is operated, and the gas exhausted from the processing vessel 203 flows through the gas exhaust pipe 231 and the gas concentration meter 600. After a predetermined time has elapsed, the valve 289b is closed and the supply of the process gas into the processing vessel 203 is stopped. After another predetermined time has elapsed, the APC valve 255 is closed and the exhaust of the inner atmosphere of the processing vessel 203 is stopped.

During the supply of the process gas into the processing vessel 203, the APC valve 255 may be closed to pressurize the processing vessel 203. By pressurizing the processing vessel 203, the atmosphere of the process gas in the processing vessel 203 can be more uniform.

While the embodiment is described by way of an example wherein hydrogen peroxide solution is supplied to the vaporizer 100 as a liquid source and the process gas containing $H_2O_2$ is supplied into the processing vessel 203, the above-described technique is not limited thereto. The above-described technique may also be applied, for example, when a liquid including ozone ($O_3$) and a liquid such as water ($H_2O$) are used as a liquid source.

When the process gas is produced by the vaporizer 100 without an oxygen-containing gas supplied into the processing vessel 203, the processing of the wafers 200 at different locations of the boat (e.g. wafers 200 at upper portion and lower portion of the boat) may not be uniform Moreover, the amount of impurities may increase, thereby degrading the film quality. Therefore, an oxygen-containing gas may be supplied into the processing vessel 203 via the oxygen-containing gas supply nozzle 502a and the supply port 502b before vaporizing the liquid source into the process gas containing $H_2O_2$ by the vaporizer 100 in order to improve process uniformity among the wafers 200 accommodated in the processing vessel 203.

After the completion of the modifying step S30 is complete, $N_2$ gas (inert gas) serving as a purge gas is supplied into the processing vessel 203 while the vacuum pump 246 vacuum-exhausts the inner atmosphere of the processing vessel 203 with the APC valve 255 open. According to the embodiment, inert gas such as $N_2$ gas and rare gases such as helium (He) gas, neon (Ne) gas and argon (Ar) gas may be used as the purge gas. The purge gas promotes the exhaust of residual process gas from the processing vessel 203.

<Drying Step S40>

After the modifying step S30 is completed, the temperature of the wafer 200 is elevated to a predetermined second temperature. The second temperature is higher than the first temperature and is equal to or lower than the temperature of the pre-baking step T30. The second temperature is, for example, 150° C. After the temperature of the wafer 200 is elevated to the second temperature, the wafer 200 and the inside of the processing vessel 203 are gradually dried while maintaining the second temperature. As a result, by-products such as ammonia, ammonium chloride, carbon and hydrogen, which are desorbed from the polysilazane film, impurities such as gas from the solvent, and impurities from to $H_2O_2$ are prevented from reattaching to the wafer 200 while drying the wafer 200.

Preferably, the flow rate of the oxygen-containing gas may be adjusted to a second flow rate greater than the first flow rate before or while elevating the temperature of the wafer 200 to the second temperature. The flow rate of the oxygen-containing gas ranges, for example, from 10 slm to 40 slm. By adjusting the flow rate of the oxygen-containing gas as described above before or while elevating the temperature of the wafer 200 is elevated to the second temperature, the efficiency of removing the impurities is improved.

<Post-Baking Step S50>

After the drying step S40 is completed, the temperature of the wafer 200 is elevated to a temperature higher than the second temperature of the drying step S40 under an atmosphere containing at least one of nitrogen, oxygen and argon to remove hydrogen remaining in the SiO film. As a result, a high quality SiO film with low hydrogen content is obtained. By performing the post-baking step S50, the SiO film with improved quality can be obtained for a device manufacturing process requiring a high quality oxide film such as STI. The post-baking step S50 may be omitted in device manufacturing processes requiring a high quality oxide film when the manufacturing throughput is prioritized.

<Cooling and Returning to Atmospheric Pressure Step S60>

After the drying step S40 or the post-baking step S50 are completed, the particles or impurities remaining in the processing vessel 203 are removed by opening the APC valve 255 and exhausting the processing vessel 203. After vacuum exhaust, the APC valve 255 is closed and the inner pressure of the processing vessel 203 is returned to atmospheric pressure. Thereafter, the wafer 200 and the processing vessel 203 are heated to remove the particles and impurities still remaining after the vacuum exhaust, the gas desorbed from the wafer 200 and the residual impurities contained in the hydrogen peroxide solution. It is preferable to the wafer 200 and the processing vessel 203 are heated under atmospheric pressure because the heat capacity of the processing vessel 203 is increased and the wafer 200 and the processing vessel 203 are more uniformly heated. After the inner pressure of the processing vessel 203 is returned to atmospheric pressure and a predetermined time has elapsed, the temperature of wafer 200 is lowered until a predetermined temperature (e.g., a temperature at which the wafer can be unloaded) is reached.

The heating by the second heater 280 is lowered while the wafer 200 is cooled. Specifically, the electrical power supplied to the second heater 280 is stopped to lower the heating by the second heater 280. The heating by the second heater 280 is stopped while the wafer 200 is cooled to maintain the quality of the films formed on the surface of the wafers 200 uniform among the wafers 200 disposed at different location of the boat. In addition, the adsorption of particles, impurities and the gas generated from the wafer 200 in the processing vessel 203 are suppressed from adsorbing to the furnace opening.

During the cooling of the wafer 200, a cooling gas supplied via a cooling gas supply pipe 249 and having a flow rate thereof controlled by the MFC 251 may be supplied into a space 260 between the processing vessel 203 and the insulating member 210 and then exhausted through a cooling gas exhaust pipe 253 by opening shutters 252, 254 and 256 and operating a blower 257. $N_2$ gas, air, rare gas such as He gas, Ne gas and Ar gas and combinations thereof may be used as the cooling gas. The space 260 can be rapidly cooled by supplying the cooling gas as well as the processing vessel 203 and the first heater 207 provided in the space 260. The wafer 200 in the processing vessel 203 can also be cooled in a shorter time.

Alternatively, with the shutters 254 and 256 closed, the cooling gas such as $N_2$ gas may be supplied into the space 260 through the cooling gas supply pipe 249 to fill the space 260 with the cooling gas for cooling the space 260. The cooling gas in the space 260 may then be exhausted through the cooling gas exhaust pipe 253 by opening the shutters 254 and 256 and operating the blower 257.

<Substrate Unloading Step S70>

Thereafter, the seal cap 219 is lowered by the boat elevator and the lower end of the processing vessel 203 is opened. The boat 217 charged with the processed wafers 200 is unloaded from the processing vessel 203 through the lower end of the processing vessel (boat unloading). The processed wafers 200 are then discharged from the boat 217 (wafer discharging). The substrate processing according to the embodiment is now complete.

(4) Measurement and Control of Consumption of Reactive Gas in Process Chamber

Next, the process of measuring (calculating) the amount of the reactive gas ($H_2O_2$ gas according to the embodiment) consumed in the process chamber 201 using the gas concentration meters 500 and 600 will be described. In the modifying step S30, the process gas containing $H_2O_2$ gas as a reactive gas is supplied into the process chamber 201 via the process gas supply pipe 289a. The gas concentration meter 500 provided in the process gas supply pipe 289a measures the concentration of the reactive gas contained in the process gas flowing through the process gas supply pipe 289a. Specifically, the light emitter 520 emits near-infrared ray to the process gas passing through the cell 540, and the light receiver 530 receives near-infrared ray that has passed through the process gas. The near-infrared rays received by the light receiver 530 are transmitted to the analyzer 510. The analyzer 510 calculates the concentration of the reactive gas in the process gas passing through cell 540 by analyzing the spectrum of the received near-infrared rays and evaluating the magnitude of unique spectral component of the light beam that has passed through the reactive gas in the process gas. The spectrum can be analyzed using known general techniques.

In the modifying step S30, the vacuum pump 246 evacuates the inner atmosphere of the processing vessel 203. The gas concentration meter 600 installed at the gas exhaust pipe 231 measures the concentration of the reactive gas contained in the exhaust gas flowing through the gas exhaust pipe 231. Specifically, the light emitter 620 emits near-infrared ray to the exhaust gas passing through the cell 640, and the light receiver 630 receives near-infrared ray that has passed through the exhaust gas. The near-infrared rays received by the light receiver 630 are transmitted to the analyzer 610.

Similar to the analyzer 510, the analyzer 610 calculates the concentration of the reactive gas in the exhaust gas passing through cell 640 by analyzing the spectrum of the received near-infrared rays and evaluating the magnitude of unique spectral component of the light beam that has passed through the reactive gas in the exhaust gas. The analyzer 610 analyzed the spectrum using known general techniques similar to the analyzer 510. The data representing the concentrations (concentration data) of the reactive gas in the process gas and the reactive gas in the exhaust gas generated by the analyzers 510 and 610, respectively, are preferably transmitted to the controller 121 at predetermined time intervals.

The controller 121 receives the concentration data acquired by the gas concentration meters 500 and 600 and sequentially stores the received concentration data in the components such as the storage 121c. The controller 121 may inform the user of the gas concentrations via the input/output device 122. The controller 121 calculates the amount of the reactive gas consumed in the process chamber 201 (hereinafter, referred to as "amount of consumed reactive gas") based on the received gas concentration. Specifically, the controller 121 calculates the difference between the gas concentrations obtained by the gas concentration meters 500 and 600 as a value indicating the amount of consumed reactive gas. The controller 121 is also capable of further calculating the difference using a predetermined coefficient or using other data acquired separately as the amount of consumed reactive gas. The calculated amount of consumed reactive gas is sequentially recorded in the components such as the storage device 121c and is also notified to the user via the input/output device 122. The calculated amount of consumed reactive gas may be recorded and notified to reflect the processing speed (reaction speed) of the wafer 200.

The controller 121 is capable of storing, in the component such as the storage 121c, the cumulative amount of consumed reactive gas calculated from the time point at which the reactive gas is first supplied to the wafer 200 in the modifying step S30, and is also capable of informing the user of the cumulative amount of consumed reactive gas via the input/output device 122. The cumulative amount of consumed reactive gas may be recorded and notified to reflect the progress of the processing of the wafer 200.

While the embodiment is described by way of an example wherein the controller 121 calculates parameters such as the amount of consumed reactive gas. However, a dedicated calculation unit for calculating a parameter such as an amount of consumed reactive gas may be employed instead of the controller 121. The calculation unit may be electrically connected to the controller 121 and can be controlled by the controller 121.

One or more advantageous effects described below are provided according to the embodiment.

(a) The gas concentration meters 500 and 600 are provided at the process gas supply pipe 289a for supplying the gas to the process chamber 201 and the gas exhaust pipe 231 for exhausting the gas from the process chamber 201, respectively. The amount of the reactive gas consumed in the process chamber 201 may be determined based on the concentrations of reactive gases in the process gas and the exhaust gas measured by the gas concentration meters 500 and 600, respectively. The amount of the reactive gas participated in the chemical reaction between the reactive gas and the wafer 200 can be determined based on the amount of consumed reactive gas.

(b) Conventionally, the thickness of the film formed on the wafer 200 was measured in order to determine the progress of substrate processing (e.g. the progress of the oxidation of the silicon-containing film by $H_2O_2$ gas). Therefore, conventionally, it was problematic that the progress is difficult to be determined during the substrate processing, that the thickness of the film should be measured directly, and that the thickness of the film cannot be measured accurately when the thickness of the film is thin. It can be regarded that the amount of consumed reactive gas accumulated from the time point at which the process gas is first supplied to the wafer 200 (the cumulative amount of consumed reactive gas) is proportional or is likely to be proportional to the progress of the wafer processing. Therefore, by measuring the cumulative amount of consumed reactive gas, it is possible to determine the progress of the processing of the wafer 200 at desired time point. By comparing the cumulative amounts of consumed reactive gas of processing lots with one another, the processing quality can be constantly managed for each processing lot.

(c) It can be regarded that the amount of reactive gas consumed per unit time is proportional or is likely to be proportional to the speed of the processing of the wafer 200 (the speed of the oxidation of the silicon-containing film by $H_2O_2$ gas according to the embodiment). Therefore, the speed of the processing of the wafer 200 can be determined by measuring the amount of consumed reactive gas per unit time. The processing quality can be maintained for each processing lot by comparing the amount of the reactive gas consumed per unit time or the change thereof among the processing lots.

(d) The amount of consumed reactive gas generally increases or decreases depending on the number of wafers 200 processed in the processing vessel 203. According to the embodiment, it is possible to determine the amount of consumed reactive gas (the amount of consumed reactive gas per unit time and the history data thereof) per batch of wafers 200 in each processing lot. Therefore, conditions such as the supplied amount of the process gas can be optimized according to the number of wafers 200.

According to the embodiment, the examples of processing described below are performed based on the calculated amount of consumed reactive gas.

First Example of Processing

As described above, since the speed of the processing of the wafer 200 can be determined by measuring the amount of consumed reactive gas per unit time, the speed of the processing of the wafer 200 can be feedback-controlled based on the measured amount of consumed reactive gas. The amount of the process gas produced by the vaporizer 100 may be adjusted by controlling the LMFC 303 and the MFC 601b based on the calculated amount of consumed reactive gas per unit time, thereby controlling the flow rate of the process gas supplied into the process chamber 201. As a result, the speed of the processing of the wafer 200 can be controlled. Specifically, when the amount of consumed reactive gas per unit time is determined to be lower than a predetermined value, the flow rate of the process gas may be increased. Similarly, when the amount of consumed reactive gas per unit time is determined to be higher than the predetermined value, the flow rate of the process gas may be decreased.

Second Example of Processing

When the amount of consumed reactive gas per unit time decreases to a predetermined level, it can be regarded that the chemical reaction occurring at the wafer 200 (the reaction of oxidizing the silicon-containing film by the $H_2O_2$ according to the embodiment) is saturated, and the modifying step can be terminated. As a result, the processing time can be shortened and the throughput can be improved by stopping the supply of the process gas.

Third Example of Processing

As described above, by measuring the cumulative amount of consumed reactive gas, the progress of the processing of the wafer 200 at each time point of substrate processing can be determined. According to the third example of processing, when the cumulative amount of consumed reactive gas reaches a predetermined level, the modifying step is terminated. As a result, the processing time can be shortened and the throughput can be improved.

Fourth Example of Processing

When the amount of consumed reactive gas per unit time is determined to be either lower than or higher than a predetermined value, an alarm may be issued via components such as the input/output device 122 to inform the user of possible fault in the processing of wafers in the process chamber 201.

Fifth Example of Processing

When the cumulative amount of consumed reactive gas is determined to be either lower than or higher than a predetermined value at the end of the modifying step, an alarm may be issued via components such as the input/output device 122 to inform the user of possible fault in the processing of a processing lot.

Sixth Example of Processing

Generally, the amount of consumed reactive gas generally increases or decreases depending on the number of wafers 200 processed in the processing vessel 203. According to the sixth example of processing, an optimal amount of the process gas may be determined per batch of wafers 200 in each processing lot. Specifically, the controller 121 records (logs) the history of the amount of consumed reactive gas per unit time for each processing lot in the component such as the storage device 121c. The controller 121 acquires the number of wafers 200 to be processed in the processing vessel 203 for each processing lot via the input/output device 122 or from the external memory device 123. Subsequently, the controller 121 associates the amount of consumed reactive gas per unit time with the number of the wafers 200 for each processing lot. As a result, the history data (pattern) of the amount of consumed reactive gas per unit time with respect to the number of wafers 200 can be obtained. The controller 121 optimizes the amount of supplied process gas by adjusting the amount of the process gas based on the history data of the amount of consumed reactive gas per unit time associated with the number of the wafers 200. The controller 121 refers to the history data of the amount of consumed reactive gas of the previous process lot having the same number of wafers 200, and controls the amount of the supplied process gas such that the amount of the supplied process gas is no less than that of the process in the history data. As a result, under-supply of the process gas can be prevented as well as over-supply of the process gas.

Seventh Example of Processing

When the difference between the history data (pattern) of the reactive gas consumption per unit time of current processing lot and the history data (pattern) of the reactive gas consumption per unit time of the previous processing lot of the same number of wafers 200 is out of a predetermined range, an alarm may be issued via components such as the input/output device 122 to inform the user of possible fault in the processing of wafers in the process chamber 201.

OTHER EMBODIMENTS

While the technique is described in detail by way of the embodiment and examples, the above-described technique is not limited thereto. The above-described technique may be modified in various ways without departing from the gist thereof.

For example, according to the above-described embodiments, a gas containing $H_2O_2$ gas is used as the process gas. However, the above-described technique is not limited thereto. That is, the process gas may be a gas produced from vaporizing a solution of a solid source (reactant) or a liquid source (reactant) dissolved in a solvent at room temperature (reactant dissolved liquid). When the boiling point of the source differs from that of the solvent, the above-described advantageous effects can be easily obtained. In addition, the above-described technique is not limited to the case where the concentration of the source increases when the process gas is re-liquefied. The above-described technique may be applied to a case where the concentration of the source decreases when the process gas is re-liquefied. According to the above-described technique, the process gas having uniform concentrated in the processing vessel 203 may be obtained even when the concentration of the source decreases due to re-liquefaction.

For example, according to the above-described embodiments, hydrogen peroxide gas is used as the process gas. However, the above-described technique is not limited thereto. $H_2O$ gas produced by the reaction of a gas containing hydrogen (hydrogen-containing gas) such as hydrogen ($H_2$) gas and a gas containing oxygen (oxygen-containing gas) such as oxygen (O)) gas. Water vapor generated by heating water may also be used as the process gas.

For example, according to the above-described embodiments, the process gas is produced by heating and vaporizing a liquid source. However, the above-described technique is not limited thereto. The above-described technique may be applied when processing a substrate in a process chamber by supplying a process gas containing a predetermined reactive gas into the process chamber.

The $H_2O_2$ contained in the process gas described above may be $H_2O_2$ molecules or a cluster of $H_2O_2$ molecules. When hydrogen peroxide solution is used to generate a gas containing $H_2O_2$, $H_2O_2$ molecules or the cluster of $H_2O_2$ molecules may be separated from the hydrogen peroxide solution. $H_2O_2$ may be in a mist state in which the clusters are combined.

When a gas (water vapor) produced by vaporizing water (liquid source) is used as the process gas, the water vapor supplied to the wafer 200 may be $H_2O$ molecules or a cluster of $H_2O$ molecules. When water is converted water from a liquid phase to a gaseous phase, $H_2O$ molecules or the cluster of $H_2O$ molecules may be separated. $H_2O$ may be in a mist state in which the clusters are combined.

While the embodiment is described by way of an example wherein the wafer having the polysilazane film is processed, the above-described technique is not limited thereto. The above-described technique may also be applied when a wafer having thereon a film containing a silazane bond (—Si—N—). The above-described technique may also be applied when a coating film including materials such as hexamethyldisilazane (HMDS), hexamethylcyclotrisilazane (HMCTS), polycarbosilazane and polyorganosilazane.

While the embodiment is described by way of an example wherein the wafer having thereon a spin-coated and pre-baked film containing a silazane bond is processed, the above-described technique is not limited thereto. The above-described technique may also be applied when oxidizing non-prebaked silicon-containing film formed by CVD method from silicon sources such as monosilane ($SiH_4$) gas and trisilylamine (TSA) gas. Particularly, the non-prebaked silicon-containing film may be formed by flowable CVD which enables the filling of grooves with high aspect ratio with the silicon-containing film. The silicon-containing film in the grooves may be subjected to oxidation process or annealing process according to the above-described technique.

According to the above-described embodiments, the substrate processing using a substrate processing apparatus having vertical type processing furnace is exemplified. However, the above-described technique is not limited thereto. The above-described technique may also be applied to the substrate processing using a single type substrate processing apparatus, a substrate processing apparatus having hot wall type processing furnace, a substrate processing apparatus having cold wall type processing furnace and a substrate processing apparatus capable of processing the wafers 200 by activating the process gas.

While the embodiment is described by way of an example wherein the concentration of the $H_2O_2$ gas is acquired by the gas concentration meter according to the analysis described above, the above-described technique is not limited thereto. The above-described technique may also be applied when the concentration of the $H_2O_2$ gas is acquired according to other well-known analyses and the same advantageous effects are obtained.

According to the technique described herein, the progress of the reaction between the substrate and the reactive gas contained in the process gas in the process chamber can be acquired, monitored and recorded during the substrate processing.

What is claimed is:

1. A substrate processing apparatus comprising:
a process chamber capable of accommodating a substrate;
a process gas supply system configured to supply a process gas into the process chamber via a process gas supply pipe;
an exhaust pipe configured to exhaust an inner atmosphere of the process chamber;
a sensor configured to be capable of detecting a first amount of the process gas which is an amount of the process gas in the process gas supply pipe or a second amount of the process gas which is an amount of the process gas contained in an exhaust gas in the exhaust pipe or detecting both of the first amount of the process gas and the second amount of the process gas; and
a controller configured to be capable of performing: (a) controlling the process gas supply system to start a supply of the process gas into the process chamber at a predetermined flow rate; and (b) controlling the process gas supply system to reduce the predetermined flow rate into the process chamber or to stop the supply of the process gas into the process chamber when a third amount of the process gas which is an amount of the process gas consumed in the process chamber becomes equal to or lower than a predetermined value.

2. The substrate processing apparatus of claim 1, wherein each of the first amount, the second amount and the third amount of the process gas is calculated based on a concentration of the process gas.

3. The substrate processing apparatus of claim 1, wherein the sensor is configured to obtain each of the first amount, the second amount and the third amount of the process gas at a constant interval.

4. The substrate processing apparatus of claim 1, wherein the third amount of the process gas is calculated based on the first amount and the second amount of the process gas.

5. The substrate processing apparatus of claim 1, wherein the sensor comprises:
a first gas concentration sensor configured to detect a first concentration of the process gas in the process gas supply pipe; and
a second gas concentration sensor configured to detect a second concentration of the process gas contained in the exhaust gas in the exhaust pipe.

6. The substrate processing apparatus of claim 5, wherein the sensor is configured to obtain a value of the first concentration and a value of the second concentration at a constant interval.

7. The substrate processing apparatus of claim 6, wherein the controller is further configured to calculate the third amount of the process gas based on a difference between the values of the first concentration and the second concentration in (b).

8. The substrate processing apparatus of claim 5, wherein the first gas concentration sensor comprises: a cell wherethrough the process gas passes; a light emitter configured to irradiate a near-infrared ray to the process gas passing through the cell; a light receiver configured to receive the near-infrared ray irradiated to the process gas; and a calculator configured to calculate the first concentration based on a spectrum of the near-infrared ray received by the light receiver.

9. The substrate processing apparatus of claim 1, wherein the third amount of the process gas is calculated based on a first concentration of the process gas in the process gas supply pipe and a second concentration of the process gas contained in the exhaust gas in the exhaust pipe.

10. The substrate processing apparatus of claim 1, wherein the process gas is capable of causing the substrate to be processed.

11. The substrate processing apparatus of claim 1, further comprising a valve provided at the process gas supply pipe, wherein the controller is further configured to control the valve to start the supply of the process gas into the process chamber by opening the valve.

12. The substrate processing apparatus of claim 1, further comprising an input/output device,
wherein the controller is further configured to control the input/output device to inform a user of a cumulative amount of the process gas consumed in the process chamber by accumulating the third amount of the process gas calculated in (b) from a start of the supply of the process gas into the process chamber.

13. The substrate processing apparatus of claim 12, wherein the controller is further configured to control the input/output device to inform the user of the cumulative amount as a progress of processing of the substrate.

14. The substrate processing apparatus of claim 1, wherein the controller is further configured to record a cumulative amount of the process gas consumed in the process chamber by accumulating the third amount of the process gas calculated in (b) from a start of the supply of the process gas into the process chamber in a memory device.

15. The substrate processing apparatus of claim 1, further comprising a process gas generator configured to generate and supply the process gas including hydrogen peroxide to the process gas supply pipe.

16. The substrate processing apparatus of claim 1, further comprising a vaporizer configured to vaporize hydrogen peroxide solution to produce the process gas and supply the process gas to the process gas supply pipe.

17. A processing method, comprising:
(a) supplying a process gas into a process chamber via a process gas supply pipe connected thereto and exhausting the process gas from the process chamber via an exhaust pipe connected thereto;
(b) detecting an amount of the process gas consumed in the process chamber based on an amount of the process gas in the process gas supply pipe or an amount of an exhaust gas in the exhaust pipe or both of the amount of the process gas in the process gas supply pipe and the amount of the exhaust gas in the exhaust pipe; and
(c) controlling a process gas supply system to reduce a predetermined flow rate of the process gas supplied into the process chamber or to stop a supply of the process gas into the process chamber when the mount of the process gas consumed in the process chamber becomes equal to or lower than a predetermined value.

18. A method of manufacturing a semiconductor device by using the processing method of claim 17, wherein a substrate is loaded into the process chamber.

19. A non-transitory computer-readable recording medium storing a program that causes, by a computer, a substrate processing apparatus to perform:
(a) supplying a process gas into a process chamber via a process gas supply pipe connected thereto with a substrate accommodated in the process chamber and exhausting the process gas from the process chamber via an exhaust pipe connected thereto;
(b) detecting an amount of the process gas consumed in the process chamber based on an amount of the process gas in the process gas supply pipe or an amount of an exhaust gas in the exhaust pipe or both of the amount of the process gas in the process gas supply pipe and the amount of the exhaust gas in the exhaust pipe; and
(c) controlling a process gas supply system to reduce a predetermined flow rate of the process gas supplied into the process chamber or to stop a supply of the process gas into the process chamber when the amount of the process gas consumed in the process chamber becomes equal to or lower than a predetermined value.

* * * * *